US012667031B2

(12) United States Patent
Haba et al.

(10) Patent No.: US 12,667,031 B2
(45) Date of Patent: Jun. 23, 2026

(54) DIRECT BONDING ON PACKAGE SUBSTRATES

(71) Applicant: ADEIA SEMICONDUCTOR BONDING TECHNOLOGIES INC., San Jose, CA (US)

(72) Inventors: Belgacem Haba, Saratoga, CA (US); Rajesh Katkar, Milpitas, CA (US); Guilian Gao, San Jose, CA (US); Cyprian Emeka Uzoh, San Jose, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 466 days.

(21) Appl. No.: 18/145,607

(22) Filed: Dec. 22, 2022

(65) Prior Publication Data

US 2023/0215836 A1 Jul. 6, 2023

Related U.S. Application Data

(60) Provisional application No. 63/293,301, filed on Dec. 23, 2021.

(51) Int. Cl.
H01L 23/495 (2006.01)
H10W 72/90 (2026.01)
(Continued)

(52) U.S. Cl.
CPC ........... H10W 99/00 (2026.01); H10W 72/90 (2026.01); H10W 80/211 (2026.01);
(Continued)

(58) Field of Classification Search
CPC ..................... H01L 24/80; H01L 24/08; H01L 2224/08225; H01L 2224/80006;
(Continued)

(56) References Cited

U.S. PATENT DOCUMENTS 4,467,342 A 8/1984 Tower
4,998,665 A 3/1991 Hayashi
(Continued)

FOREIGN PATENT DOCUMENTS

CN 201407528 Y 2/2010
CN 103681646 3/2014
(Continued)

OTHER PUBLICATIONS

Amirfeiz et al., "Formation of silicon structures by plasma-activated wafer bonding," Journal of The Electrochemical Society, 2000, vol. 147, No. 7, pp. 2693-2698.
(Continued)

*Primary Examiner* — Niki H Nguyen
(74) *Attorney, Agent, or Firm* — KNOBBE, MARTENS, OLSON & BEAR, LLP

(57) ABSTRACT

A bonded structure with a package substrate comprising an inorganic, insulating first bonding layer and first conductive features at a surface thereof and an electronic component comprising an inorganic, insulating second bonding layer and second conductive features at a surface thereof wherein the first bonding layer and the second bonding layer are directly bonded to one another, and the first and second conductive features are directly bonded to one another.

18 Claims, 9 Drawing Sheets

(51) Int. Cl.
    *H10W 99/00*      (2026.01)
    *H10W 80/00*      (2026.01)
    *H10W 90/00*      (2026.01)

(52) U.S. Cl.
    CPC ........ *H10W 80/312* (2026.01); *H10W 80/327*
        (2026.01); *H10W 90/794* (2026.01)

(58) Field of Classification Search
    CPC . H01L 2224/80895; H01L 2224/80896; H01L
        24/05; H01L 2224/0603; H01L
        2924/15311; H01L 2224/16227; H01L
        25/0657; H01L 25/0753; H01L 24/06;
        H01L 2224/32145; H01L 2224/48472;
        H01L 2224/73253; H01L 2224/83801;
        H01L 2224/16145; H01L 2225/06513;
        H01L 24/33; H01L 2924/351; H01L
        2224/08145; H01L 2225/06517; H01L
        21/4846; H01L 21/568; H01L
        2224/81801; H01L 23/142; H01L
        2224/12105
    See application file for complete search history.

(56)          References Cited

U.S. PATENT DOCUMENTS

| | | | |
|---|---|---|---|
| 5,019,673 A | 5/1991 | Juskey et al. |
| 5,051,802 A | 9/1991 | Prost et al. |
| 5,087,585 A | 2/1992 | Hayashi |
| 5,322,593 A | 6/1994 | Hasegawa et al. |
| 5,399,898 A | 3/1995 | Rostoker |
| 5,729,896 A | 3/1998 | Dalal et al. |
| 5,753,536 A | 5/1998 | Sugiyama et al. |
| 5,771,555 A | 6/1998 | Eda et al. |
| 5,854,507 A | 12/1998 | Miremadi et al. |
| 5,956,605 A | 9/1999 | Akram et al. |
| 5,985,739 A | 11/1999 | Plettner et al. |
| 5,998,808 A | 12/1999 | Matsushita |
| 6,008,126 A | 12/1999 | Leedy |
| 6,080,640 A | 6/2000 | Gardner et al. |
| 6,121,688 A | 9/2000 | Akagawa |
| 6,265,775 B1 | 7/2001 | Seyyedy |
| 6,322,903 B1 | 11/2001 | Siniaguine et al. |
| 6,374,770 B1 | 4/2002 | Lee |
| 6,410,983 B1 | 6/2002 | Moriizumi et al. |
| 6,423,640 B1 | 7/2002 | Lee et al. |
| 6,437,434 B1 | 8/2002 | Sugizaki |
| 6,448,153 B2 | 9/2002 | Siniaguine |
| 6,465,892 B1 | 10/2002 | Suga |
| 6,500,694 B1 | 12/2002 | Enquist |
| 6,582,991 B1 | 6/2003 | Maeda et al. |
| 6,686,665 B1 | 2/2004 | Gao et al. |
| 6,768,208 B2 | 7/2004 | Lin et al. |
| 6,782,610 B1 | 8/2004 | Iijima et al. |
| 6,867,073 B1 | 3/2005 | Enquist |
| 6,887,769 B2 | 5/2005 | Kellar et al. |
| 6,908,027 B2 | 6/2005 | Tolchinsky et al. |
| 6,958,285 B2 | 10/2005 | Siniaguine |
| 6,964,915 B2 | 11/2005 | Farnworth et al. |
| 6,984,889 B2 | 1/2006 | Kimura |
| 7,045,453 B2 | 5/2006 | Canaperi et al. |
| 7,078,811 B2 | 7/2006 | Suga |
| 7,098,542 B1 | 8/2006 | Hoang et al. |
| 7,105,980 B2 | 9/2006 | Abbott et al. |
| 7,126,212 B2 | 10/2006 | Enquist et al. |
| 7,193,423 B1 | 3/2007 | Dalton et al. |
| 7,319,197 B2 | 1/2008 | Oggioni et al. |
| 7,354,798 B2 | 4/2008 | Pogge et al. |
| 7,385,283 B2 | 6/2008 | Wu et al. |
| 7,452,743 B2 | 11/2008 | Oliver et al. |
| 7,554,203 B2 | 6/2009 | Zhou et al. |
| 7,582,971 B2 | 9/2009 | Kameyama et al. |
| 7,589,409 B2 | 9/2009 | Gibson et al. |
| 7,663,231 B2 | 2/2010 | Chang et al. |

| | | | |
|---|---|---|---|
| 7,750,488 B2 | 7/2010 | Patti et al. |
| 7,759,751 B2 | 7/2010 | Ono |
| 7,786,572 B2 | 8/2010 | Chen |
| 7,803,693 B2 | 9/2010 | Trezza |
| 7,816,856 B2 | 10/2010 | Cok et al. |
| 7,902,643 B2 | 3/2011 | Tuttle |
| 7,977,789 B2 | 7/2011 | Park |
| 8,008,764 B2 | 8/2011 | Joseph et al. |
| 8,049,303 B2 | 11/2011 | Osaka et al. |
| 8,064,224 B2 | 11/2011 | Mahajan et al. |
| 8,168,458 B2 | 5/2012 | Do et al. |
| 8,178,963 B2 | 5/2012 | Yang |
| 8,178,964 B2 | 5/2012 | Yang |
| 8,183,127 B2 | 5/2012 | Patti et al. |
| 8,193,632 B2 | 6/2012 | Chang et al. |
| 8,227,904 B2 | 7/2012 | Braunisch et al. |
| 8,237,289 B2 | 8/2012 | Urakawa |
| 8,241,961 B2 | 8/2012 | Kim et al. |
| 8,258,633 B2 | 9/2012 | Sezi et al. |
| 8,263,434 B2 | 9/2012 | Pagaila et al. |
| 8,314,007 B2 | 11/2012 | Vaufredaz |
| 8,349,635 B1 | 1/2013 | Gan et al. |
| 8,377,798 B2 | 2/2013 | Peng et al. |
| 8,409,927 B1 | 4/2013 | Yim |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,519,514 B2 | 8/2013 | Fujii |
| 8,524,533 B2 | 9/2013 | Tong et al. |
| 8,536,693 B2 | 9/2013 | Dungan et al. |
| 8,618,659 B2 | 12/2013 | Sato et al. |
| 8,620,164 B2 | 12/2013 | Heck et al. |
| 8,647,987 B2 | 2/2014 | Yang et al. |
| 8,691,601 B2 | 4/2014 | Izuha |
| 8,697,493 B2 | 4/2014 | Sadaka |
| 8,703,542 B2 | 4/2014 | Lin et al. |
| 8,704,364 B2 | 4/2014 | Banijamali |
| 8,704,384 B2 | 4/2014 | Wu et al. |
| 8,710,648 B2 | 4/2014 | Xue |
| 8,716,105 B2 | 5/2014 | Sadaka et al. |
| 8,791,575 B2 | 7/2014 | Oganesian et al. |
| 8,802,538 B1 | 8/2014 | Liu |
| 8,809,123 B2 | 8/2014 | Liu et al. |
| 8,810,006 B2 | 8/2014 | Yu et al. |
| 8,816,404 B2 | 8/2014 | Kim et al. |
| 8,841,002 B2 | 9/2014 | Tong |
| 8,872,349 B2 | 10/2014 | Chiu et al. |
| 8,878,353 B2 | 11/2014 | Haba et al. |
| 8,901,748 B2 | 12/2014 | Manusharow et al. |
| 8,912,648 B2 | 12/2014 | Lin et al. |
| 8,912,670 B2 | 12/2014 | Teh et al. |
| 8,975,726 B2 | 3/2015 | Chen et al. |
| 8,987,137 B2 | 3/2015 | Bachman et al. |
| 8,988,299 B2 | 3/2015 | Kam et al. |
| 9,006,873 B2 | 4/2015 | Nikitin et al. |
| 9,018,094 B2 | 4/2015 | Kosenko et al. |
| 9,048,306 B2 | 6/2015 | Chi et al. |
| 9,059,179 B2 | 6/2015 | Karikalan et al. |
| 9,093,350 B2 | 7/2015 | Endo et al. |
| 9,126,236 B2 | 9/2015 | Roos et al. |
| 9,136,219 B2 | 9/2015 | Iwase et al. |
| 9,136,293 B2 | 9/2015 | Yee et al. |
| 9,142,517 B2 | 9/2015 | Liu et al. |
| 9,153,552 B2 | 10/2015 | Teh et al. |
| 9,159,690 B2 | 10/2015 | Chiu |
| 9,171,756 B2 | 10/2015 | Enquist et al. |
| 9,171,816 B2 | 10/2015 | Teh et al. |
| 9,184,104 B1 | 11/2015 | Chia et al. |
| 9,184,125 B2 | 11/2015 | Enquist et al. |
| 9,190,380 B2 | 11/2015 | Teh et al. |
| 9,202,769 B2 | 12/2015 | Lin et al. |
| 9,224,669 B2 | 12/2015 | Xue |
| 9,224,704 B2 | 12/2015 | Landru |
| 9,230,941 B2 | 1/2016 | Chen et al. |
| 9,252,172 B2 | 2/2016 | Chow et al. |
| 9,257,399 B2 | 2/2016 | Kuang et al. |
| 9,269,701 B2 | 2/2016 | Starkston et al. |

(56)  References Cited

U.S. PATENT DOCUMENTS

| | | | |
|---|---|---|---|
| 9,275,971 B2 | 3/2016 | Chiu et al. | |
| 9,299,736 B2 | 3/2016 | Chen et al. | |
| 9,312,229 B2 | 4/2016 | Chen et al. | |
| 9,331,149 B2 | 5/2016 | Tong et al. | |
| 9,337,235 B2 | 5/2016 | Chen et al. | |
| 9,349,703 B2 | 5/2016 | Chiu et al. | |
| 9,355,997 B2 | 5/2016 | Katkar et al. | |
| 9,368,563 B2 | 6/2016 | Lin et al. | |
| 9,368,866 B2 | 6/2016 | Yu | |
| 9,379,091 B2 | 6/2016 | England et al. | |
| 9,385,024 B2 | 7/2016 | Tong et al. | |
| 9,391,143 B2 | 7/2016 | Tong et al. | |
| 9,394,161 B2 | 7/2016 | Cheng et al. | |
| 9,402,312 B2 | 7/2016 | Shen et al. | |
| 9,412,662 B2 | 8/2016 | Lin et al. | |
| 9,431,368 B2 | 8/2016 | Enquist et al. | |
| 9,431,371 B2 | 8/2016 | Karikalan et al. | |
| 9,437,572 B2 | 9/2016 | Chen et al. | |
| 9,443,796 B2 | 9/2016 | Chou et al. | |
| 9,443,824 B1 | 9/2016 | We et al. | |
| 9,461,007 B2 | 10/2016 | Chun et al. | |
| 9,466,586 B1 | 10/2016 | Choi et al. | |
| 9,476,898 B2 | 10/2016 | Takano | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,564,414 B2 | 2/2017 | Enquist et al. | |
| 9,589,947 B2 * | 3/2017 | Hwang ......... H01L 25/50 | |
| 9,601,353 B2 | 3/2017 | Huang et al. | |
| 9,620,481 B2 | 4/2017 | Edelstein et al. | |
| 9,627,365 B1 | 4/2017 | Yu et al. | |
| 9,656,852 B2 | 5/2017 | Cheng et al. | |
| 9,666,502 B2 | 5/2017 | Chen et al. | |
| 9,666,559 B2 | 5/2017 | Wang et al. | |
| 9,704,824 B2 | 7/2017 | Lin et al. | |
| 9,704,827 B2 | 7/2017 | Huang et al. | |
| 9,716,033 B2 | 7/2017 | Enquist et al. | |
| 9,722,098 B1 | 8/2017 | Chung et al. | |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,799,587 B2 | 10/2017 | Fujii et al. | |
| 9,852,988 B2 | 12/2017 | Enquist et al. | |
| 9,881,882 B2 | 1/2018 | Hsu et al. | |
| 9,893,004 B2 | 2/2018 | Yazdani | |
| 9,899,442 B2 | 2/2018 | Katkar | |
| 9,929,050 B2 | 3/2018 | Lin | |
| 9,941,180 B2 | 4/2018 | Kim et al. | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 9,966,360 B2 | 5/2018 | Yu et al. | |
| 10,002,844 B1 | 6/2018 | Wang et al. | |
| 10,026,605 B2 | 7/2018 | Doub et al. | |
| 10,032,722 B2 | 7/2018 | Yu et al. | |
| 10,074,630 B2 | 9/2018 | Kelly et al. | |
| 10,075,657 B2 | 9/2018 | Fahim et al. | |
| 10,204,893 B2 | 2/2019 | Uzoh et al. | |
| 10,269,756 B2 | 4/2019 | Uzoh | |
| 10,269,853 B2 | 4/2019 | Katkar et al. | |
| 10,276,619 B2 | 4/2019 | Kao et al. | |
| 10,276,909 B2 | 4/2019 | Huang et al. | |
| 10,403,577 B1 | 9/2019 | Huang et al. | |
| 10,418,277 B2 | 9/2019 | Cheng et al. | |
| 10,434,749 B2 | 10/2019 | Tong | |
| 10,446,456 B2 | 10/2019 | Shen et al. | |
| 10,446,487 B2 | 10/2019 | Huang et al. | |
| 10,446,532 B2 | 10/2019 | Uzoh et al. | |
| 10,508,030 B2 | 12/2019 | Katkar et al. | |
| 10,522,499 B2 | 12/2019 | Enquist et al. | |
| 10,559,507 B1 | 2/2020 | Saketi et al. | |
| 10,707,087 B2 | 7/2020 | Uzoh et al. | |
| 10,727,204 B2 | 7/2020 | Agarwal et al. | |
| 10,727,219 B2 | 7/2020 | Uzoh et al. | |
| 10,784,191 B2 | 9/2020 | Huang et al. | |
| 10,790,262 B2 | 9/2020 | Uzoh et al. | |
| 10,840,135 B2 | 11/2020 | Uzoh | |
| 10,840,205 B2 | 11/2020 | Fountain, Jr. et al. | |
| 10,854,578 B2 | 12/2020 | Morein | |
| 10,879,212 B2 | 12/2020 | Uzoh et al. | |
| 10,886,177 B2 | 1/2021 | DeLaCruz et al. | |
| 10,892,246 B2 | 1/2021 | Uzoh | |
| 10,923,408 B2 | 2/2021 | Huang et al. | |
| 10,923,413 B2 | 2/2021 | DeLaCruz | |
| 10,950,547 B2 | 3/2021 | Mohammed et al. | |
| 10,964,664 B2 | 3/2021 | Mandalapu et al. | |
| 10,985,133 B2 | 4/2021 | Uzoh | |
| 10,991,804 B2 | 4/2021 | DeLaCruz et al. | |
| 10,998,292 B2 | 5/2021 | Lee et al. | |
| 11,004,757 B2 | 5/2021 | Katkar et al. | |
| 11,011,494 B2 | 5/2021 | Gao et al. | |
| 11,011,503 B2 | 5/2021 | Wang et al. | |
| 11,031,285 B2 | 6/2021 | Katkar et al. | |
| 11,037,919 B2 | 6/2021 | Uzoh et al. | |
| 11,056,348 B2 | 7/2021 | Theil | |
| 11,056,390 B2 | 7/2021 | Uzoh et al. | |
| 11,069,734 B2 | 7/2021 | Katkar | |
| 11,088,099 B2 | 8/2021 | Katkar et al. | |
| 11,127,738 B2 | 9/2021 | DeLaCruz et al. | |
| 11,145,626 B2 | 10/2021 | Hwang et al. | |
| 11,158,573 B2 | 10/2021 | Uzoh et al. | |
| 11,158,606 B2 | 10/2021 | Gao et al. | |
| 11,169,326 B2 | 11/2021 | Huang et al. | |
| 11,171,117 B2 | 11/2021 | Gao et al. | |
| 11,176,450 B2 | 11/2021 | Teig et al. | |
| 11,195,748 B2 | 12/2021 | Uzoh et al. | |
| 11,205,625 B2 | 12/2021 | DeLaCruz et al. | |
| 11,244,920 B2 | 2/2022 | Uzoh | |
| 11,256,004 B2 | 2/2022 | Haba et al. | |
| 11,264,357 B1 | 3/2022 | DeLaCruz et al. | |
| 11,276,676 B2 | 3/2022 | Enquist et al. | |
| 11,296,044 B2 | 4/2022 | Gao et al. | |
| 11,296,053 B2 | 4/2022 | Uzoh et al. | |
| 11,329,034 B2 | 5/2022 | Tao et al. | |
| 11,348,898 B2 | 5/2022 | DeLaCruz et al. | |
| 11,355,404 B2 | 6/2022 | Gao et al. | |
| 11,355,443 B2 | 6/2022 | Huang et al. | |
| 11,367,652 B2 | 6/2022 | Uzoh et al. | |
| 11,373,963 B2 | 6/2022 | DeLaCruz et al. | |
| 11,380,597 B2 | 7/2022 | Katkar et al. | |
| 11,385,278 B2 | 7/2022 | DeLaCruz et al. | |
| 11,387,202 B2 | 7/2022 | Haba et al. | |
| 11,387,214 B2 | 7/2022 | Wang et al. | |
| 11,393,779 B2 | 7/2022 | Gao et al. | |
| 11,462,419 B2 | 10/2022 | Haba | |
| 11,471,999 B2 | 10/2022 | Kumar et al. | |
| 11,476,213 B2 | 10/2022 | Haba et al. | |
| 11,515,291 B2 | 11/2022 | DeLaCruz et al. | |
| 11,538,781 B2 | 12/2022 | Haba | |
| 11,626,363 B2 | 4/2023 | Haba et al. | |
| 11,631,647 B2 | 4/2023 | Haba | |
| 2002/0000328 A1 | 1/2002 | Motomura et al. | |
| 2002/0003307 A1 | 1/2002 | Suga | |
| 2002/0004288 A1 | 1/2002 | Nishiyama | |
| 2002/0074668 A1 | 6/2002 | Hofstee et al. | |
| 2004/0070045 A1 | 4/2004 | Suguro et al. | |
| 2004/0084414 A1 | 5/2004 | Sakai et al. | |
| 2004/0157407 A1 | 8/2004 | Tong et al. | |
| 2004/0238927 A1 | 12/2004 | Miyazawa | |
| 2005/0040530 A1 | 2/2005 | Shi | |
| 2005/0133930 A1 | 6/2005 | Savastisuk et al. | |
| 2005/0153522 A1 | 7/2005 | Hwang et al. | |
| 2005/0218518 A1 | 10/2005 | Jiang et al. | |
| 2006/0057945 A1 | 3/2006 | Hsu et al. | |
| 2006/0087042 A1 | 4/2006 | Kameyama et al. | |
| 2006/0278331 A1 | 12/2006 | Dugas et al. | |
| 2007/0045798 A1 | 3/2007 | Horie et al. | |
| 2007/0080442 A1 | 4/2007 | Meyer-Berg | |
| 2007/0096294 A1 | 5/2007 | Ikeda et al. | |
| 2007/0111386 A1 | 5/2007 | Kim et al. | |
| 2007/0122635 A1 | 5/2007 | Lu et al. | |
| 2007/0158024 A1 | 7/2007 | Addison et al. | |
| 2007/0158827 A1 | 7/2007 | Schuster | |

(56) References Cited

U.S. PATENT DOCUMENTS

| | | |
|---|---|---|
| 2007/0222048 A1 | 9/2007 | Huang |
| 2007/0295456 A1 | 12/2007 | Gudeman et al. |
| 2008/0079105 A1 | 4/2008 | Chang et al. |
| 2008/0231311 A1 | 9/2008 | Condorelli et al. |
| 2008/0237782 A1 | 10/2008 | Williams et al. |
| 2008/0244902 A1 | 10/2008 | Blackwell et al. |
| 2008/0265421 A1 | 10/2008 | Brunnbauer et al. |
| 2008/0308928 A1 | 12/2008 | Chang |
| 2009/0039523 A1 | 2/2009 | Jiang et al. |
| 2009/0068831 A1 | 3/2009 | Enquist et al. |
| 2009/0072357 A1 | 3/2009 | Tang et al. |
| 2009/0102002 A1 | 4/2009 | Chia et al. |
| 2009/0149023 A1 | 6/2009 | Koyanagi |
| 2009/0227089 A1 | 9/2009 | Plaut et al. |
| 2009/0252939 A1 | 10/2009 | Park et al. |
| 2009/0283898 A1 | 11/2009 | Janzen et al. |
| 2009/0321939 A1 | 12/2009 | Chandrasekaran |
| 2010/0081236 A1 | 4/2010 | Yang et al. |
| 2010/0123268 A1 | 5/2010 | Menard |
| 2010/0129999 A1 | 5/2010 | Zingher et al. |
| 2010/0167534 A1 | 7/2010 | Iwata |
| 2010/0176482 A1 | 7/2010 | Dennard et al. |
| 2010/0213603 A1 | 8/2010 | Smeys et al. |
| 2010/0213819 A1 | 8/2010 | Cok et al. |
| 2010/0225005 A1 | 9/2010 | Nishio et al. |
| 2010/0230806 A1 | 9/2010 | Huang et al. |
| 2010/0258952 A1 | 10/2010 | Fjelstad |
| 2010/0259166 A1 | 10/2010 | Cok et al. |
| 2010/0314741 A1 | 12/2010 | Lee et al. |
| 2010/0327424 A1 | 12/2010 | Braunisch et al. |
| 2011/0062549 A1 | 3/2011 | Lin |
| 2011/0074033 A1 | 3/2011 | Kaltalioglu et al. |
| 2011/0095403 A1 | 4/2011 | Lee et al. |
| 2011/0108943 A1 | 5/2011 | Dennard et al. |
| 2011/0163457 A1 | 7/2011 | Mohan et al. |
| 2011/0290552 A1 | 12/2011 | Palmateer et al. |
| 2012/0001339 A1 | 1/2012 | Malatkar |
| 2012/0049332 A1 | 3/2012 | Chen et al. |
| 2012/0074585 A1 | 3/2012 | Koo et al. |
| 2012/0187516 A1 | 7/2012 | Sato |
| 2012/0194719 A1 | 8/2012 | Churchwell et al. |
| 2012/0199960 A1 | 8/2012 | Cosue et al. |
| 2012/0212384 A1 | 8/2012 | Kam et al. |
| 2012/0319300 A1 | 12/2012 | Kim et al. |
| 2013/0037962 A1 | 2/2013 | Xue |
| 2013/0069239 A1 | 3/2013 | Kim et al. |
| 2013/0122655 A1 | 5/2013 | Yu et al. |
| 2013/0161836 A1 | 6/2013 | Yeom et al. |
| 2013/0187292 A1 | 7/2013 | Semmelmeyer et al. |
| 2013/0217188 A1 | 8/2013 | Wang et al. |
| 2013/0249045 A1 | 9/2013 | Kang et al. |
| 2013/0249106 A1 | 9/2013 | Lin et al. |
| 2013/0265733 A1 | 10/2013 | Herbsommer et al. |
| 2013/0299997 A1 | 11/2013 | Sadaka |
| 2013/0320572 A1 | 12/2013 | Chang et al. |
| 2014/0001652 A1 | 1/2014 | Chen et al. |
| 2014/0013606 A1 | 1/2014 | Nah et al. |
| 2014/0015109 A1 | 1/2014 | Lei et al. |
| 2014/0071652 A1 | 3/2014 | McShane et al. |
| 2014/0124957 A1 | 5/2014 | Iwase et al. |
| 2014/0134804 A1 | 5/2014 | Kelly et al. |
| 2014/0145558 A1* | 5/2014 | Hori .................... H10N 30/072 |
| | | 310/313 R |
| 2014/0154839 A1 | 6/2014 | Ahn et al. |
| 2014/0175655 A1 | 6/2014 | Chen et al. |
| 2014/0225246 A1 | 8/2014 | Henderson et al. |
| 2014/0225795 A1 | 8/2014 | Yu |
| 2014/0299981 A1 | 10/2014 | Goh et al. |
| 2014/0312511 A1 | 10/2014 | Nakamura |
| 2014/0370658 A1 | 12/2014 | Tong et al. |
| 2015/0021754 A1 | 1/2015 | Lin et al. |
| 2015/0041980 A1 | 2/2015 | Ahn et al. |
| 2015/0064498 A1 | 3/2015 | Tong |
| 2015/0102468 A1 | 4/2015 | Kang et al. |
| 2015/0113195 A1 | 4/2015 | Kim |
| 2015/0115448 A1 | 4/2015 | Maier |
| 2015/0123240 A1 | 5/2015 | Bowman et al. |
| 2015/0171050 A1 | 6/2015 | Chen et al. |
| 2015/0179481 A1 | 6/2015 | Lin |
| 2015/0194406 A1 | 7/2015 | Teh et al. |
| 2015/0228632 A1 | 8/2015 | Yu et al. |
| 2015/0262845 A1 | 9/2015 | Hwang et al. |
| 2015/0262928 A1 | 9/2015 | Shen et al. |
| 2015/0303170 A1 | 10/2015 | Kim et al. |
| 2015/0327367 A1 | 11/2015 | Shen et al. |
| 2015/0340285 A1 | 11/2015 | Enquist et al. |
| 2016/0020193 A1 | 1/2016 | Lee et al. |
| 2016/0042998 A1 | 2/2016 | Pueschner et al. |
| 2016/0126634 A1 | 5/2016 | Liu et al. |
| 2016/0133571 A1 | 5/2016 | Lee et al. |
| 2016/0163650 A1 | 6/2016 | Gao et al. |
| 2016/0172302 A1 | 6/2016 | Song et al. |
| 2016/0247761 A1 | 8/2016 | Song et al. |
| 2016/0260684 A1 | 9/2016 | Zhai et al. |
| 2016/0300813 A1 | 10/2016 | Zhai et al. |
| 2016/0300817 A1 | 10/2016 | Do et al. |
| 2016/0322330 A1 | 11/2016 | Lin et al. |
| 2016/0327977 A1 | 11/2016 | Tang et al. |
| 2016/0329284 A1 | 11/2016 | We et al. |
| 2016/0343682 A1 | 11/2016 | Kawasaki |
| 2016/0343685 A1 | 11/2016 | Lin et al. |
| 2016/0379885 A1 | 12/2016 | Uzoh et al. |
| 2017/0062366 A1 | 3/2017 | Enquist |
| 2017/0062383 A1 | 3/2017 | Yee et al. |
| 2017/0079135 A1 | 3/2017 | Hu et al. |
| 2017/0125379 A1 | 5/2017 | Chen et al. |
| 2017/0148764 A1 | 5/2017 | Wang et al. |
| 2017/0148777 A1 | 5/2017 | Bono et al. |
| 2017/0179029 A1 | 6/2017 | Enquist et al. |
| 2017/0179078 A1 | 6/2017 | Jung et al. |
| 2017/0194271 A1 | 7/2017 | Hsu et al. |
| 2017/0200711 A1 | 7/2017 | Uzoh et al. |
| 2017/0263595 A1 | 9/2017 | Kurita et al. |
| 2017/0316998 A1 | 11/2017 | Marutani et al. |
| 2017/0338214 A1 | 11/2017 | Uzoh et al. |
| 2017/0345763 A1 | 11/2017 | Cheah et al. |
| 2017/0365580 A1 | 12/2017 | Shih et al. |
| 2018/0005984 A1 | 1/2018 | Yu et al. |
| 2018/0005992 A1 | 1/2018 | Yu et al. |
| 2018/0012787 A1 | 1/2018 | Oka et al. |
| 2018/0026008 A1 | 1/2018 | Jeng et al. |
| 2018/0026227 A1 | 1/2018 | Kim et al. |
| 2018/0053746 A1 | 2/2018 | Yu et al. |
| 2018/0096931 A1 | 4/2018 | Huang et al. |
| 2018/0102251 A1 | 4/2018 | DeLaCruz et al. |
| 2018/0122774 A1 | 5/2018 | Huang et al. |
| 2018/0122777 A1 | 5/2018 | Wong et al. |
| 2018/0130769 A1 | 5/2018 | Tan et al. |
| 2018/0130772 A1 | 5/2018 | Yu et al. |
| 2018/0138101 A1 | 5/2018 | Yu et al. |
| 2018/0174995 A1 | 6/2018 | Wang et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1 | 8/2018 | Gambino et al. |
| 2018/0226375 A1 | 8/2018 | Enquist et al. |
| 2018/0273377 A1 | 9/2018 | Katkar et al. |
| 2018/0286805 A1 | 10/2018 | Huang et al. |
| 2018/0294212 A1 | 10/2018 | Chen et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0337157 A1 | 11/2018 | Wang et al. |
| 2018/0366437 A1 | 12/2018 | Chen et al. |
| 2018/0366442 A1 | 12/2018 | Gu et al. |
| 2018/0366446 A1 | 12/2018 | Haba et al. |
| 2019/0096741 A1 | 3/2019 | Uzoh et al. |
| 2019/0096842 A1 | 3/2019 | Fountain, Jr. et al. |
| 2019/0115277 A1 | 4/2019 | Yu et al. |
| 2019/0131277 A1 | 5/2019 | Yang et al. |
| 2019/0148269 A1 | 5/2019 | Cheah et al. |

(56) References Cited

U.S. PATENT DOCUMENTS

| | | |
|---|---|---|
| 2019/0189607 A1 | 6/2019 | Uzoh et al. |
| 2019/0198407 A1 | 6/2019 | Huang et al. |
| 2019/0198409 A1 | 6/2019 | Katkar et al. |
| 2019/0206791 A1 | 7/2019 | Pietambaram et al. |
| 2019/0221548 A1 | 7/2019 | Huang et al. |
| 2019/0265411 A1 | 8/2019 | Huang et al. |
| 2019/0273039 A1 | 9/2019 | Im |
| 2019/0333550 A1 | 10/2019 | Fisch |
| 2019/0333871 A1 | 10/2019 | Chen et al. |
| 2019/0348336 A1 | 11/2019 | Katkar et al. |
| 2019/0371763 A1 | 12/2019 | Agarwal et al. |
| 2019/0385935 A1 | 12/2019 | Gao et al. |
| 2019/0385966 A1 | 12/2019 | Gao et al. |
| 2019/0385981 A1 | 12/2019 | Chen et al. |
| 2020/0006309 A1 | 1/2020 | Chen et al. |
| 2020/0013637 A1 | 1/2020 | Haba |
| 2020/0013667 A1 | 1/2020 | Leobandung |
| 2020/0013765 A1 | 1/2020 | Fountain, Jr. et al. |
| 2020/0035641 A1 | 1/2020 | Fountain, Jr. et al. |
| 2020/0043853 A1 | 2/2020 | Kim et al. |
| 2020/0058617 A1 | 2/2020 | Wu et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0118973 A1 | 4/2020 | Wang et al. |
| 2020/0126906 A1 | 4/2020 | Uzoh et al. |
| 2020/0135684 A1 | 4/2020 | Kim et al. |
| 2020/0176419 A1 | 6/2020 | Dabral et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0243455 A1* | 7/2020 | Wang .................... H10B 41/50 |
| 2020/0279821 A1 | 9/2020 | Haba et al. |
| 2020/0294908 A1 | 9/2020 | Haba et al. |
| 2020/0294920 A1 | 9/2020 | Hariri et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335357 A1 | 10/2020 | Rogers et al. |
| 2020/0335408 A1 | 10/2020 | Gao et al. |
| 2020/0371154 A1 | 11/2020 | DeLaCruz et al. |
| 2020/0395300 A1 | 12/2020 | Xie et al. |
| 2020/0395321 A1 | 12/2020 | Katkar et al. |
| 2020/0403006 A1 | 12/2020 | DeLaCruz et al. |
| 2020/0411483 A1 | 12/2020 | Uzoh et al. |
| 2021/0020577 A1 | 1/2021 | Hu |
| 2021/0028080 A1 | 1/2021 | Pietambaram et al. |
| 2021/0057343 A1 | 2/2021 | Chang et al. |
| 2021/0057352 A1 | 2/2021 | Agarwal et al. |
| 2021/0066219 A1 | 3/2021 | Chen et al. |
| 2021/0082797 A1 | 3/2021 | Lee et al. |
| 2021/0082822 A1 | 3/2021 | Aleksov et al. |
| 2021/0082825 A1 | 3/2021 | Strong et al. |
| 2021/0091063 A1 | 3/2021 | Ninomiya et al. |
| 2021/0098411 A1 | 4/2021 | Liff et al. |
| 2021/0098412 A1 | 4/2021 | Haba et al. |
| 2021/0098421 A1 | 4/2021 | Wu et al. |
| 2021/0111125 A1 | 4/2021 | Chen et al. |
| 2021/0118864 A1 | 4/2021 | DeLaCruz et al. |
| 2021/0125933 A1 | 4/2021 | Chen et al. |
| 2021/0125965 A1 | 4/2021 | Lu |
| 2021/0134724 A1 | 5/2021 | Rubin et al. |
| 2021/0143125 A1 | 5/2021 | DeLaCruz et al. |
| 2021/0181510 A1 | 6/2021 | Katkar et al. |
| 2021/0183847 A1 | 6/2021 | Uzoh et al. |
| 2021/0193603 A1 | 6/2021 | DeLaCruz et al. |
| 2021/0193624 A1 | 6/2021 | DeLaCruz et al. |
| 2021/0193625 A1 | 6/2021 | Katkar et al. |
| 2021/0202396 A1 | 7/2021 | Wu et al. |
| 2021/0225780 A1 | 7/2021 | Wu et al. |
| 2021/0242152 A1 | 8/2021 | Fountain, Jr. et al. |
| 2021/0280507 A1 | 9/2021 | Aldrete et al. |
| 2021/0280517 A1 | 9/2021 | May et al. |
| 2021/0280522 A1 | 9/2021 | Liu |
| 2021/0296282 A1 | 9/2021 | Gao et al. |
| 2021/0305122 A1 | 9/2021 | Lai et al. |
| 2021/0305202 A1 | 9/2021 | Uzoh et al. |
| 2021/0335726 A1 | 10/2021 | Wu et al. |
| 2021/0343690 A1 | 11/2021 | Salmon |
| 2021/0358875 A1 | 11/2021 | Lee et al. |
| 2021/0366820 A1 | 11/2021 | Uzoh |
| 2021/0366970 A1 | 11/2021 | Katkar |
| 2021/0375708 A1 | 12/2021 | Kuo et al. |
| 2021/0375737 A1 | 12/2021 | Lin |
| 2021/0384133 A1 | 12/2021 | Ong et al. |
| 2021/0384135 A1 | 12/2021 | Kuan et al. |
| 2021/0391271 A1 | 12/2021 | Hsu et al. |
| 2021/0391272 A1 | 12/2021 | Tsai et al. |
| 2021/0391283 A1 | 12/2021 | Hsu et al. |
| 2021/0391284 A1 | 12/2021 | Hsu et al. |
| 2021/0407941 A1 | 12/2021 | Haba |
| 2022/0005787 A1 | 1/2022 | Han et al. |
| 2022/0077063 A1 | 3/2022 | Haba |
| 2022/0077087 A1 | 3/2022 | Haba |
| 2022/0122934 A1 | 4/2022 | Haba |
| 2022/0130738 A1 | 4/2022 | Cobb et al. |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0278084 A1 | 9/2022 | Ong et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2022/0328467 A1 | 10/2022 | Chen et al. |
| 2022/0336436 A1 | 10/2022 | Zhang et al. |
| 2022/0375864 A1 | 11/2022 | Wang et al. |
| 2022/0392881 A1 | 12/2022 | Yu et al. |
| 2023/0005850 A1 | 1/2023 | Fountain, Jr. |
| 2023/0012157 A1 | 1/2023 | Yu et al. |
| 2023/0019869 A1 | 1/2023 | Mirkarimi et al. |
| 2023/0036441 A1 | 2/2023 | Haba et al. |
| 2023/0067190 A1 | 3/2023 | Lung |
| 2023/0067677 A1 | 3/2023 | Lee et al. |
| 2023/0069183 A1 | 3/2023 | Haba |
| 2023/0079607 A1 | 3/2023 | Ecton et al. |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0161120 A1 | 5/2023 | Yu et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197554 A1 | 6/2023 | Lan et al. |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038702 A1 | 2/2024 | Uzoh |
| 2024/0055407 A1 | 2/2024 | Workman |

(56) References Cited

U.S. PATENT DOCUMENTS

| | | |
|---|---|---|
| 2024/0063135 A1 | 2/2024 | Ng et al. |
| 2024/0079376 A1 | 3/2024 | Suwito et al. |
| 2024/0088101 A1 | 3/2024 | Gao et al. |
| 2024/0105674 A1 | 3/2024 | Uzoh et al. |
| 2024/0170411 A1 | 5/2024 | Chang et al. |
| 2024/0186248 A1 | 6/2024 | Haba et al. |
| 2024/0186250 A1 | 6/2024 | Ecton et al. |
| 2024/0186268 A1 | 6/2024 | Uzoh et al. |
| 2024/0186269 A1 | 6/2024 | Haba |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0337800 A1 | 10/2024 | Yu et al. |
| 2025/0391762 A1 | 12/2025 | Uzoh |
| 2025/0391794 A1 | 12/2025 | Uzoh |

FOREIGN PATENT DOCUMENTS

| | | | | |
|---|---|---|---|---|
| CN | 113782520 A | 12/2021 | | |
| CN | 113809018 A | 12/2021 | | |
| CN | 114203679 A | * 3/2022 | ........... | H01L 23/492 |
| EP | 1011133 A1 | 6/2000 | | |
| EP | 2 685 491 A2 | 1/2014 | | |
| JP | 04-337694 | 11/1992 | | |
| JP | 2000-100679 | 4/2000 | | |
| JP | 2001-102479 | 4/2001 | | |
| JP | 2001-284520 | 10/2001 | | |
| JP | 2002-353416 | 12/2002 | | |
| JP | 2002-359345 | 12/2002 | | |
| JP | 2004-193493 | 7/2004 | | |
| JP | 2008-130603 A | 6/2008 | | |
| JP | 2011-171614 | 9/2011 | | |
| JP | 2013-033786 A | 2/2013 | | |
| JP | 2018-160519 | 10/2018 | | |
| KR | 10-2001-0104643 | 11/2001 | | |
| KR | 10-2010-0123755 | 11/2010 | | |
| KR | 10-2015-0097798 | 8/2015 | | |
| KR | 10-2020-0092236 | 8/2020 | | |
| WO | WO 2005/043584 A2 | 5/2005 | | |
| WO | WO 2006/100444 A1 | 9/2006 | | |
| WO | WO 2008/112101 A2 | 9/2008 | | |
| WO | WO 2010/024678 A1 | 3/2010 | | |
| WO | WO 2017/034654 A1 | 3/2017 | | |
| WO | WO 2017/052652 A1 | 3/2017 | | |
| WO | WO 2017/151442 A1 | 9/2017 | | |

OTHER PUBLICATIONS

Braunisch, H. et al., "High-speed performance of silicon bridge die-to-die interconnects," 2011 IEEE, pp. 95-98.

Ceramic Microstructures: Control at the Atomic Level, Recent Progress in Surface Activated Bonding, 1998, pp. 385-389.

Chung et al., "Room temperature GaAs-on-Si and InP-on-Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

"Curing Agents for Epoxy Resin," Three Bond Technical News, Dec. 20, 1990, 10 pages.

Dunsworth et al., "A method for building low loss multi-layer wiring for superconducting microwave devices". Applied Physics Letts. Feb. 5, 2018;112(6) 10 pages.

Farrens et al., "Chemical free room temperature wafer to wafer direct bonding," J. Electrochem. Soc., The Electrochemical Society, Inc., Nov. 1995, vol. 142, No. 11. pp. 3949-3955.

Farrens et al., "Chemical free wafer bonding of silicon to glass and sapphire," Electrochemical Society Proceedings vol. 95-7, 1995, pp. 72-77.

Fowler, Michelle et al., "A Novel Photosensitive Permanent Bonding Material Designed forPolymer/Metal Hybrid Bonding Applications," CS MANTECH Conference, May 9-12, 2022, pp. 211-215.

Frumusanu, Andrei, "TSMC's version of EMIB is 'LSI': Currently in pre-qualification," AnandTech, https://www.anandtech.com/show/16031/tsmcs-version-of-emib-lsi-3dfabric, Aug. 25, 2020, 6 pages.

Fukushima, T. et al., "New three-dimensional integration technology using self-assembly technique," International Electron Devices Meeting Dec. 5-7, 2005, IEEE, Dec. 5, 2005, pp. 348-351.

Gosele et al., "Semiconductor Wafer Bonding: A flexible approach to materials combinations in microelectronics; micromechanics and optoelectronics," IEEE, 1997, pp. 23-32.

Hosoda et al., "Effect of the surface treatment on the room-temperature bonding of Al to Si and SiO2," Journal of Materials Science, Jan. 1, 1998, vol. 33, Issue 1, pp. 253-258.

Hosoda et al., "Room temperature GaAs—Si and InP—Si wafer direct bonding by the surface activated bonding method," Nuclear Inst. And Methods in Physics Research B, 1997, vol. 121, Nos. 1-4, pp. 203-206.

Howlader et al., "A novel method for bonding of ionic wafers," Electronics Components and Technology Conference, 2006, IEEE, pp. 7-pp.

Howlader et al., "Bonding of p-Si/n-InP wafers through surface activated bonding method at room temperature," Indium Phosphide and Related Materials, 2001, IEEE International Conference On, pp. 272-275.

Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.

Howlader et al., "Investigation of the bonding strength and interface current of p-Si-on-GaAs wafers bonded by surface activated bonding at room temperature," J. Vac. Sci. Technol. B 19, Nov./Dec. 2001, pp. 2114-2118.

Huang et al., "Wafer-Level Polymer/Metal Hybrid Bonding Using a Photosensitive Permanent Bonding Material". Chip Scale Review. Mar.-Apr. 2022;26(2): 49-53.

Itoh et al., "Characteristics of fritting contacts utilized for micromachined wafer probe cards," 2000 American Institute of Physics, AIP Review of Scientific Instruments, vol. 71, 2000, pp. 2224.

Itoh et al., "Characteristics of low force contact process for MEMS probe cards," Sensors and Actuators A: Physical, Apr. 1, 2002, vols. 97-98, pp. 462-467.

Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.

Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.

Jin et al. Fabrication of Al air-bridge on coplanar waveguide. 2018 Chinese Phys. B 27 100310; 3 pages; DOI: 10.1088/1674-1056/27/10/100310.

Khan et al., "Technologies for printing sensors and electronics over large flexible substrates," IEEE Sensors Journal, Jun. 2015, vol. 15, No. 6, pp. 3164-3185.

Kim et al., "Low temperature direct Cu-Cu bonding with low energy ion activation method," Electronic Materials and Packaging, 2001, IEEE, pp. 193-195.

Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.

Kim et al., "Wafer-scale activated bonding of Cu—CU, Cu—Si, and Cu—SiO2 at low temperature," Proceedings—Electrochemical Society, 2003, vol. 19, pp. 239-247.

Matsuzawa et al., "Room-temperature interconnection of electroplated Au microbump by means of surface activated bonding

(56) References Cited

OTHER PUBLICATIONS method," Electronic Components and Technology Conference, 2001, 51st Proceedings, IEEE, pp. 384-387.

Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.

"Photo Etching DBC for Power Circuits—Direct Bond Copper (DBC) on Ceramic Used for Power Circuits," Conard Corporation, 2021, downloaded Nov. 9, 21, https://www.conardcorp.com/photo-etching-dbc-for-power-circuits/, 2 pages.

Reiche et al., "The effect of a plasma pretreatment on the Si/Si bonding behaviour," Electrochemical Society Proceedings, 1998, vol. 97-36, pp. 437-444.

Roberds et al., "Low temperature, in situ, plasma activated wafer bonding," Electrochemical Society Proceedings, 1997, vol. 97-36, pp. 598-606.

Shigetou et al., "Room temperature bonding of ultra-fine pitch and low-profiled Cu electrodes for bump-less interconnect," 2003 Electronic Components and Technology Conference, pp. 848-852.

Shigetou et al., "Room-temperature direct bonding of CMP-Cu film for bumpless interconnection," Electronic Components and Technology Conference, 51st Proceedings, 2001, IEEE, pp. 755-760.

Shingo et al., "Design and fabrication of an electrostatically actuated MEMS probe card,"Transducers, Solid-State Sensors, Actuators and Microsystems, 12th International Conference, Jun. 8-12, 2003, vol. 2, pp. 1522-1525.

"Silane Coupling Agents," Shin-Etsu Chemical Co., Ltd., Jun. 2017, 28 pages.

Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.

Suga et al., "A new bumping process using lead-free solder paste," Electronics Packaging Manufacturing, IEEE Transactions on (vol. 25, Issue 4), IEEE, Oct. 2002, pp. 253-256.

Suga et al., "A new wafer-bonder of ultra-high precision using surface activated bonding (SAB) concept," Electronic Components and Technology Conference, 2001, IEEE, pp. 1013-1018.

Suga et al., "Bump-less interconnect for next generation system packaging," Electronic Components and Technology Conference, 2001, IEEE, pp. 1003-1008.

Suga et al., "Surface activated bonding—an approach to joining at room temperature," Ceramic Transactions: Structural Ceramics Joining II, The American Ceramic Society, 1993, pp. 323-331.

Suga et al., "Surface activated bonding for new flip chip and bumpless interconnect systems," Electronic Components and Technology Conference, 2002, IEEE, pp. 105-111.

Suga, "UHV room temperature joining by the surface activated bonding method," Advances in science and technology, Techna, Faenza, Italie, 1999, pp. C1079-C1089.

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.

Takagi et al., "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.

Takagi et al., "Effect of surface roughness on room-temperature wafer bonding by Ar beam surface activation," Japanese Journal of Applied Physics, 1998, vol. 37, Part 1, No. 1, pp. 4197.

Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.

Takagi et al., "Room temperature silicon wafer direct bonding in vacuum by Ar beam irradiation," Micro Electro Mechanical Systems, MEMS '97 Proceedings, 1997, IEEE, pp. 191-196.

Takagi et al., "Room-temperature bonding of lithium niobate and silicon wafers by argon-beam surface activation," Appl. Phys. Lett., 1999. vol. 74, pp. 2387.

Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.

Takagi et al., "Room-temperature wafer bonding of silicon and lithium niobate by means of argon-beam surface activation," Integrated Ferroelectrics: An International Journal, 2002, vol. 50, Issue 1, pp. 53-59.

Takagi et al., "Surface activated bonding silicon wafers at room temperature," Appl. Phys. Lett. 68, 2222 (1996).

Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.

Tong et al., "Low temperature wafer direct bonding," Journal of Microelectromechanical systems, Mar. 1994, vol. 3, No. 1, pp. 29-35.

Topol et al., "Enabling technologies for wafer-level bonding of 3D MEMS and integrated circuit structures," 2004 Electronics Components and Technology Conference, 2004 IEEE, pp. 931-938.

Uhrmann, T. et al., "Heterogeneous integration by collective die-to-wafer bonding," Chip Scale Review, Nov./Dec. 2018, vol. 22, No. 6, pp. 10-12.

Wang et al., "Reliability and microstructure of Au—Al and Au—Cu direct bonding fabricated by the Surface Activated Bonding," Electronic Components and Technology Conference, 2002, IEEE, pp. 915-919.

Wang et al., "Reliability of Au bump—Cu direct interconnections fabricated by means of surface activated bonding method," Microelectronics Reliability, May 2003, vol. 43, Issue 5, pp. 751-756.

Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.

Xu et al., "New Au—Al interconnect technology and its reliability by surface activated bonding," Electronic Packaging Technology Proceedings, Oct. 28-30, 2003, Shanghai, China, pp. 479-483.

Zhao, O. et al., "Insights into the Mechanical Properties of Ultrathin Perfluoropolyether-Silane Coatings," Langmuir 2022, vol. 38, No. 20, pp. 6435-6442, DOI: 10.1021/acs.langmuir.2c00625.

International Search Report and Written Opinion mailed Apr. 22, 2019 in International Application No. PCT/US2018/064982, 13 pages.

Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Hasi, J. et al., "Advanced Interconnects for Particle Physics and Beyond," SLAC National Accelerator Laboratory, Ronald Lipton, 3D Integration of Sensors and Electronics, Oct. 13, 2017, 25 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

NASA SBIR/STTR Technologies, Proposal No. 09-1 S5.05-9060—Reliable Direct Bond Copper Ceramic Packages for High Temperature Power Electronics, Contract No. NNX10CE23P, Ender Savrun, PhD, Sienna Technologies, Inc.—Woodinvile, WA.

Onsemi AR0820 image, cross section of a CMOS image sensor product. The part in the image was shipped on Sep. 16, 2021.

(56)                References Cited

OTHER PUBLICATIONS

Applicant makes No. representation that the part in the image is identical to the part identified in the separately submitted reference BUSH, Nov. 8, 2018, Electronics Weekly.com ("BUSH article"); however, the imaged part and the part shown in the BUSH article share the part number "ONSEMI AR0820.".

Ross, John, "Rigid-flex PCB design: Benefits and design best practices," Technical Article, Sep. 24, 2018, 7 pages.

Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260.".

Urteaga, M. et al., "CMP process development on III-V substrates for 3D heterogeneous integration," Teledyne Scientific & Imaging, Thousand Oaks, CA, 3 pages.

Urteaga, M. et al., "THz bandwidth InP HBT technologies and heterogeneous integration with Si CMOS," Teledyne Scientific Company, Thousand Oaks, CA, 7 pages.

International Search Report and Written Opinion mailed May 17, 2023, issued in International Application No. PCT/US2022/082245, 15 pages.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Moriceau, H. et al., "Overview of recent direct wafer bonding advances and applications," Advances in Natural Sciences-Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(l), 6 pages.

Plobi, A. et al., "Wafer direct bonding: tailoring adhesion between brittle materials," Materials Science and Engineering Review Journal, 1999, R25, 88 pages.

Aixtron, "3D integration unites InP, GaN and silicon CMOS." Compound Semiconductor. Jan.-Feb. 2018; 24(1): 7 pages; downloaded from URL: https://compoundsemiconductor.net/article/104207/3D_Integration_Unites_InP_GaN_And_Silicon_CMOS on Sep. 10, 2024.

Carter et al., "Wafer-Scale InP/Si CMOS 3d Integration Using Low-Temperature Oxide Bonding". In Compound Semiconductor Week (CSW, Santa Barbara, CA, (2015)), pp. 493-494.

Carter Andrew, "3D Heterogenous Integration of CMOS, InP, and GaN Devices Using Hybrid Wafer Bonding". In 2016 3DASIP Conference Dec. 14, 2016; 25 Pages.

Carter et al., Q-Band InP/CMOS Receiver and Transmitter Beamformer Channels Fabricated by 3D Heterogeneous Integration. In 2017 IEEE MTT-S Intern Microwave Symposium (IMS) Jun. 4, 2017 (pp. 1760-1763).

Carter et al., "Si/InP Heterogeneous Integration Techniques from the Wafer-Scale (Hybrid Wafer Bonding) to the Discrete Transistor (Micro-Transfer Printing)," 2018 IEEE SOI-3D-Subthreshold Microelectronics Technology Unified Conference (S3S), Burlingame, CA, USA, 2018, pp. 1-4, doi: 10.1109/S3S.2018.8640196.

Chen et al., "Optical properties of amorphous $Ta_2O_5$ thin films deposited by RF magnetron sputtering," Optical Materials. Nov. 1, 2019;97:109404; 7 pages.

Cheng et al., "Grating couplers on silicon photonics: Design principles, emerging trends and practical issues," Micromachines 2020, 11, 666. Micromachines. Apr. 13, 2022;13(4):606; 25 pages.

Eibelhuber et al., "Advanced bonding techniques for photonic integrated circuits." In CS Mantech Conference May 19, 2014, Denver, CO—USA; pp. 331-334.

Elsherbine et al., "Hybrid bonding interconnect for advanced heterogeneously integrated processors." In 2021 IEEE 71st Electronic Components and Technology Conference (ECTC) Jun. 1, 2021 (pp. 1014-1019).

Jedrzejowski et al., "Mechanical and optical properties of hard SiCN coatings prepared by PECVD," Thin Solid Films. Jan. 30, 2004;447:201-207.

Li et al., "Process development of low-loss LPCVD silicon nitride waveguides on 8-inch wafer," Applied Sciences. Mar. 13, 2023;13(6):3660; 12 pages.

Matsumura et al., "Fabrication of Copper Damascene Patterns on Polymide Using Direct Metallization on Trench Templates Generated by Imprint Lithography," Langmuir 2010, 26(14), 12448-12454.

Permana, David "Chemical Mechanical Planarization of Copper/Polyimide Mamascene Structure with Glycerol-Based Slurry," Rensselaer Polytechnic Institute Troy, New York, Aug. 1999.

Price, et al., "Damascene coppper interconnects with polymer ILDs," Thin Solid Films 308-309 (1997) 523-528.

Suzuki et al., "Cu/Polyimide Multilayer Interconnections Fabricated by Nanoimprint at Every Lithography Process," Journal of Photopolymer Science and Technology, vol. 27, No. 1 (2014) 73-80.

Urteaga et al., "CMP Process Development on III-V Substrates for 3D Heterogeneous Integration." CS ManTech. May 1, 2019, 5 pages; downloaded from URL: https://csmantech.org/paper/8-4-cmp-process-development-on-iii-v-substrates-for-3d-heterogeneous-integration/.

You et al., Widely tunable refractive index silicon nitride films deposited by ion-assisted pulsed DC reactive magnetron sputtering. Optical Materials. Feb. 1, 2023;136:113354; 8 pages.

European Extended Search Report mailed Oct. 6, 2025, in Application No. 22912737.8, 13 pages.

* cited by examiner

DIRECT BONDING ON PACKAGE SUBSTRATES

CROSS-REFERENCE TO RELATED APPLICATIONS

This application claims priority to U.S. Provisional Application No. 63/293,301 filed Dec. 23, 2021 titled "DIRECT BONDING ON PACKAGE SUBSTRATES," the disclosure of which is incorporated herein by reference in its entirety for all purposes.

BACKGROUND

Field

The field relates to bonded structures, and, in particular to bonded structures in which an electronic component is directly bonded on a package substrate without an intervening adhesive.

Description of the Related Art

Integrated device packages include a package substrate and one or more integrated device dies mounted to the package substrate. The integrated device die typically includes bond pads at a finer pitch than corresponding pads or terminals of the package substrate. It can be challenging to electrically connect dies with fine-pitched pads to package substrates having pads or terminals with a coarse pitch. Accordingly, there remains a continued need for improved packaging structures.

BRIEF DESCRIPTION OF THE DRAWINGS

The detailed description is set forth with reference to the accompanying figures. The use of the same numbers in different figures indicates similar or identical items For this discussion, the devices and systems illustrated in the figures are shown as having a multiplicity of components. Various implementations of devices and/or systems, as described herein, may include fewer components and remain within the scope of the disclosure. Alternatively, other implementations of devices and/or systems may include additional components, or various combinations of the described components, and remain within the scope of the disclosure

DETAILED DESCRIPTION

Figure 1B:
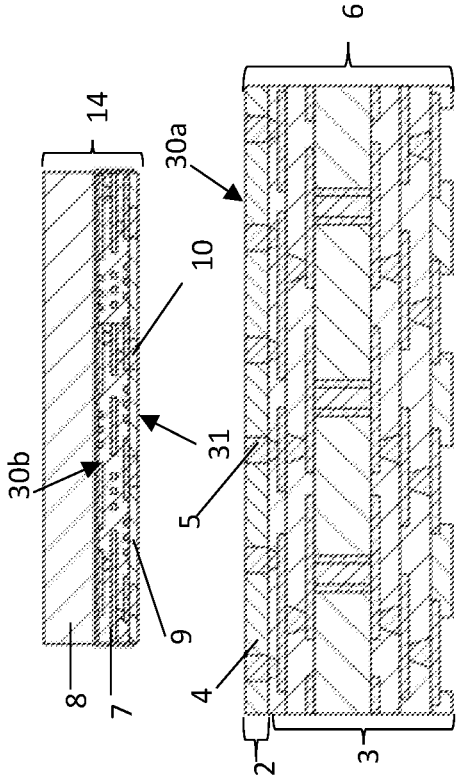
FIG. 1B depicts a schematic side sectional view of a packaging carrier and an electronic component to be bonded to the packaging carrier.

Creating direct hybrid bonds between electrical components and substrates without the use of adhesive can be challenging. In particular, creating the proper environment between the electrical components and the substrates to induce a stable bond is even more difficult when the substrates are organic or ceramic substrates. Direct hybrid bonding, as compared with solder bonding, enables very fine pitch electrical connections between vertically adjacent dies, while also significantly reducing the thickness of the die stack, as compared to using thick solder balls between the dies. Various embodiments disclosed herein include a bonded structure in which an electronic component is directly bonded to a package substrate without an intervening adhesive. The electronic component can comprise an integrated device die with active circuitry, a passive electronic device, or other suitable type of component. As noted above, electronic components such as semiconductor elements (e.g., integrated device dies) may have bond pads that are spaced apart with a fine pitch, due at least in part to the use of high resolution semiconductor fabrication techniques. By contrast, package substrates, such as laminate substrates (e.g., printed circuit board, or PCB substrates), are formed using layering techniques that do not achieve such high resolutions. Typical laminate package substrates can achieve pitches of less than 35 microns, which is higher than pitches for semiconductor elements, which can be less than 1 micron, less than 0.5 microns, or less than 0.1 microns. For example, in various arrangements, typical laminate substrates can achieve pitches or linewidths in a range of 50 microns to 500 microns, significantly higher than the pitches of semiconductor elements which can be in a range of 0.01 microns to 20 microns. Due to at least the significant difference in pitches between the semiconductor element and the package substrate, it can be challenging to provide fine pitch wiring layers on package substrates. The difference in pitch between the semiconductor chip and the package substrate may effectively limit the number of interconnects between them, adversely affecting the bandwidth of the device. Additional path lengths introduced due to the implementation of interposers, etc. significantly increase the parasitics, thereby reducing the system performance.

Hybrid direct bonding techniques have been used to bond semiconductor elements to one another without an intervening adhesive. For example, as explained below, dies or wafers can include nonconductive bonding regions directly bonded to one another and conductive features (e.g., contact pads, vias, etc.) directly bonded to one another. Hybrid bonding techniques can create electrical connections between conductive features at pitches less than 50 microns, less than 20 microns, less than 10 microns, less than 5 microns, less than 0.5 microns, or less than 0.1 micron. For example, hybrid bonding techniques can create electrical connections between conductive features at pitches or linewidths in a range of 0.1 microns to 50 microns. However, direct bonding techniques have not been considered compatible with a package substrate (for example, to bond a semiconductor element to a package substrate), such as an organic laminate substrate, a ceramic substrate, wafer-level or panel-level redistribution layer (RDL) substrate, or the like. Indeed, as explained below, semiconductor elements that are to be direct bonded are polished (for example, using chemical mechanical polishing, or CMP) to a very high degree of smoothness, for example, to a surface roughness of less than 2 nm root mean square (RMS), or less than 1 nm RMS. Unlike semiconductor elements, package substrates, which include multiple layers having each having a surface roughness on the order of microns, may not be polished to the degree of smoothness used in direct bonding techniques, which has been an obstacle to using hybrid bonding techniques to mount components to package substrates. Moreover, package substrates are made of a softer material (e.g., including organic core materials) than semiconductor elements (e.g., a semiconductor material, such as silicon), which can make it more difficult to ensure planarity. PCB materials are also sensitive to high temperatures. Connecting semiconductor elements or components to a package substrate may also introduce stresses, due to, e.g., mismatches in coefficient of thermal expansion (CTE). Further difficulties include contamination of the bonding surface in fabrication facilities that process package substrates, which typically are not as clean as the facilities for fabricating semiconductor devices. Indeed, cleanroom standards for a semiconductor fabrication facility are typically several orders of magnitude better than that required for packaging facilities.

Beneficially, the embodiments disclosed herein address these challenges by providing methods and structures for directly bonding an electronic component (such as a semiconductor element, wiring layer, or any other type of electronic component) on a package substrate. The disclosed embodiments can provide the connection of fine-pitched electronic components to coarser-pitched package substrates, while providing sufficiently smooth surfaces for direct bonding and without creating thermal stresses.

Figure 1A:
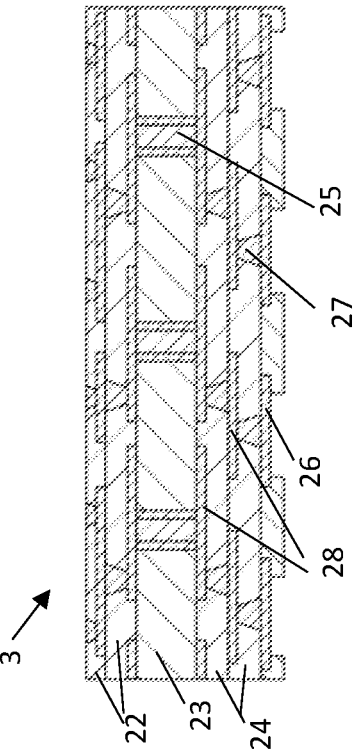
FIG. 1A depicts a schematic side sectional view of a package substrate.

FIG. 1A depicts a schematic side sectional view of a package substrate 3. A package substrate 3 includes structures and components for providing electrical connections between a device or component (such as an integrated device die, a passive component, or any other component) and an external device or system (such as a system motherboard of a larger electrical system). Such components of a package substrate 3 can comprise a laminate substrate include upper insulating wiring layer(s) 22, a core 23, lower insulating wiring layer(s) 24, vias 25, terminals 26, vertical interconnects 27, and horizontal traces 28. The terminals 26 can be configured to connect to the external device or system, for example, by way of solder balls or other conductive connectors. Electrical signals, power, or ground can be provided to an upper surface of the package substrate 3 by way of the horizontal traces 28, the vertical interconnects 27, and the vias 25 extending through the core 23. In the illustrated embodiments, as explained herein, package substrate 3 can comprise an organic substrate in which one or more of the insulating layers and the core comprise an organic material. In some embodiments, as explained herein, the package substrate 3 can be formed of a ceramic material.

FIG. 1B depicts a schematic side sectional view of a packaging carrier 6 and an electronic component 14 to be directly bond to the packaging carrier 6. The packaging carrier 6 having an inorganic, insulating first bonding layer 4 and first conductive features 5 as part of a bonding structure 2 on a surface thereof. As used herein, a "packaging carrier" refers to the combination of a package substrate 3 and bonding structure 2 formed thereover. The bonding layer 4 material can include, for example, silicon oxide with nitrogen terminations, or other materials as described below.

In the embodiments disclosed herein, the electronic component 14 can comprise any suitable type of electronic component that is to be directly bonded to the packaging carrier 6. In the illustrated embodiment, for example, the electronic component 14 includes a wiring layer 7, a temporary carrier 8, and a second insulating bonding layer 9 having second conductive features 10 at least partially embedded therein. The wiring layer 7 with a temporary carrier 8 is configured to bond with the packaging carrier 6 by way of the second bonding layer 9. The insulating bonding layer 4 of the package carrier 6 can directly bond with the second insulating bonding layer 9 of the electronic component 14 without the use of an adhesive. The first conductive features 5 can directly bond to corresponding second conductive features 10 of the electronic component 14 without an intervening adhesive.

Figure 1D:
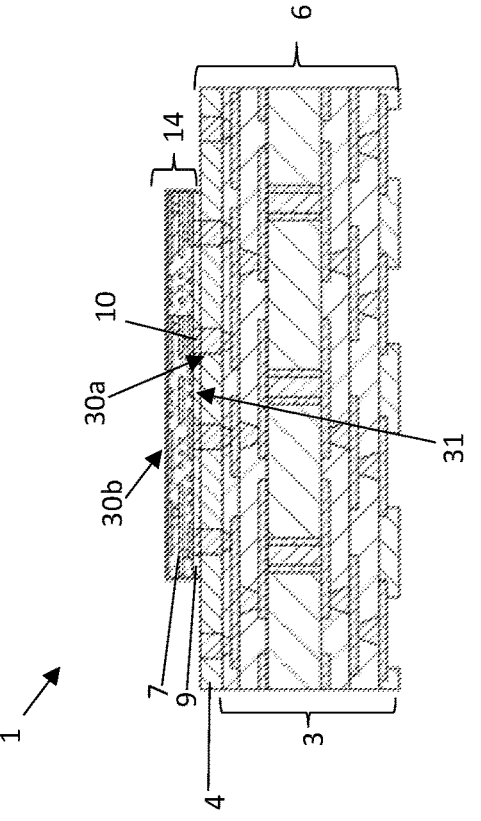
FIG. 1C-D depict a schematic side sectional view of a bonded structure including a package substrate with an inorganic, insulating bonding layer.
Figure 1C:
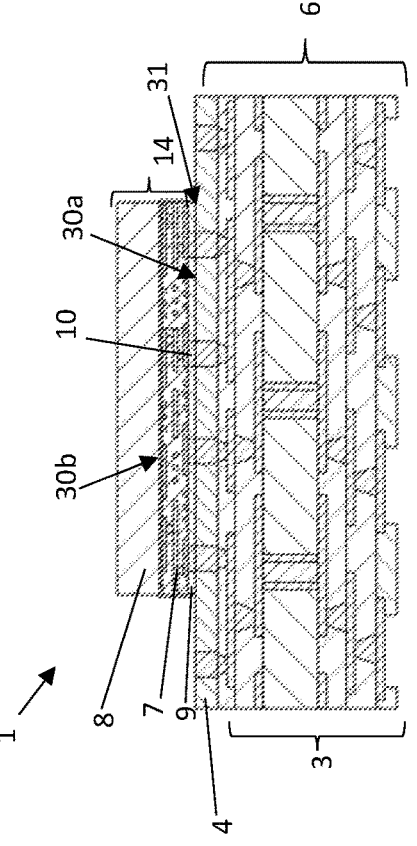

FIG. 1C depicts a schematic side sectional view of a bonded structure 1 including a packaging carrier 6 directly bonded to an electronic component 14 bonded without the use of an adhesive. The bonding layers 4 and 9 are directly bonded without the use of an adhesive such that the electronic component 14 and the packaging carrier 6 form a bonded structure. 1 FIG. 1D depicts a schematic side sectional view of a bonded structure 1. In FIG. 1D, the temporary carrier 8 is removed from the bonded structure 1 (for example, by lapping, polishing, etching, optical delamination methods, etc.), which in FIG. 1D includes the packaging carrier substrate 6 direct hybrid bonded to the wiring layer 7. For example, the wiring layer 7 can be directly bonded to the packaging carrier 6 and can include an insulating bonding layer 9 (e.g., a dielectric layer) and second conductive contacts 10 configured for hybrid direct bonding at an upper surface 30a of the bonding structure 2 of the package carrier 6 opposite a lower surface 31 of the bonding layer 9 of the electronic component 14 to which the carrier is bonded. As shown below in FIGS. 4A-E a semiconductor device 11 can be directly bonded to an upper hybrid bonding surface 30b of the electronic component 14 without an adhesive. As explained below, the semiconductor device 11 can comprise any suitable type of device, such as an integrated device die or chip with circuitry patterned therein, a passive electronic component 14 (such as a resistor, capacitor, inductor, etc.), an optical component, or any other suitable type of component. It should be appreciated that, in various embodiments, parameters such as material CTE, layer thicknesses, etc. may vary according to the design of the package. Although the carrier 8 of FIG. 1C is removed to form the wiring layer 7 of FIG. 1D in the illustrated embodiment, it should be appreciated that, in other embodiments, the carrier 8 may not be removed, e.g., the carrier 8 may comprise a device or component that remains in the bonded structure 1.

Figure 2:
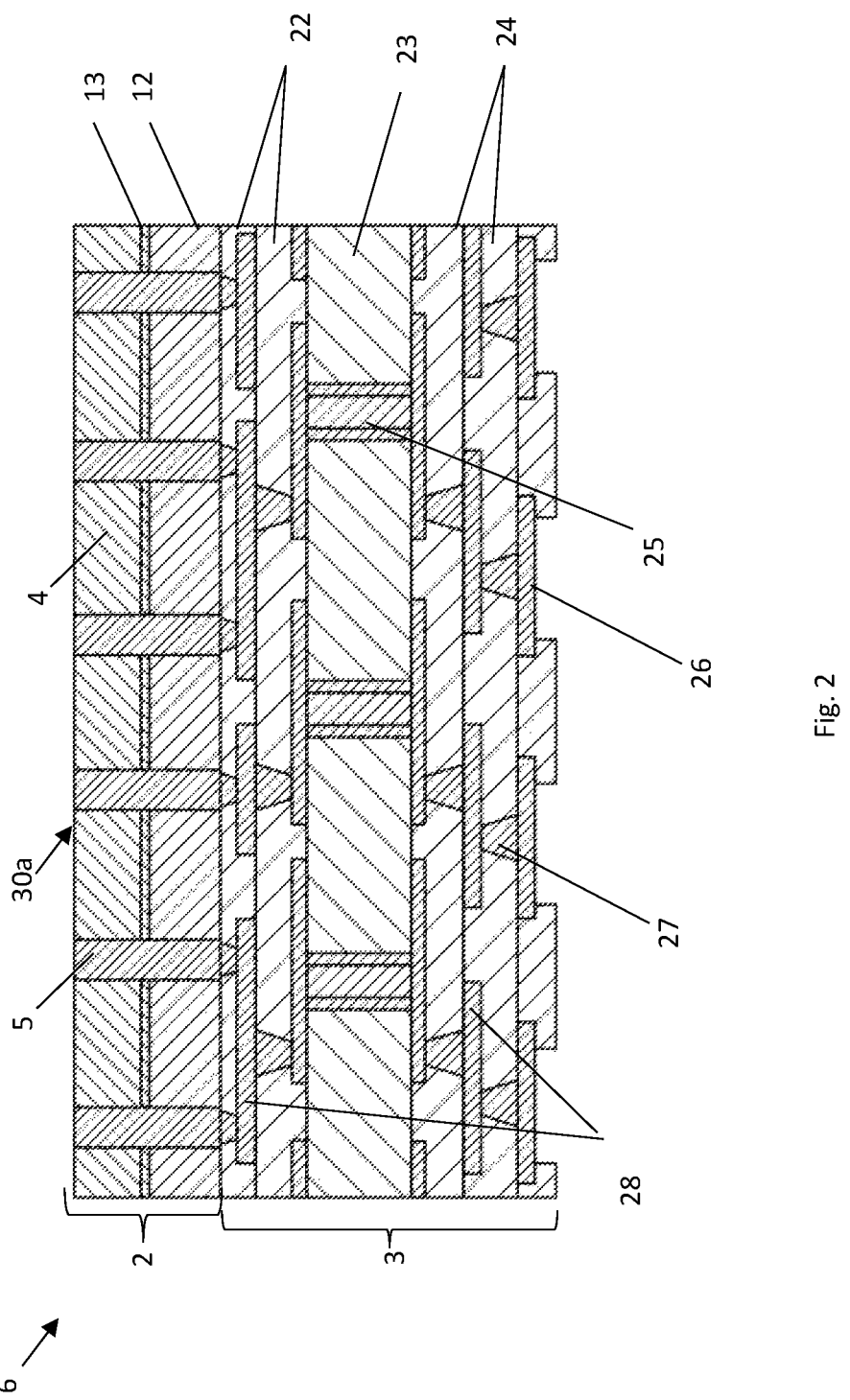
FIG. 2 is a schematic side sectional view of a package carrier including a buffer layer with a coefficient of thermal expansion between that of the package substrate and the bonding layer.

FIG. 2 is a schematic side sectional view of a packaging carrier 6 including a buffer layer 12 with a coefficient of thermal expansion between that of the package substrate 3 and the insulating bonding layer 4. In the illustrated embodiment of FIG. 1, the electronic component 14 comprises a wiring layer 7 formed on or bonded to a temporary carrier 8. In the illustrated embodiment as seen in the detailed view of FIG. 2, the package substrate 3 comprises an organic substrate, including an organic core 23 materials and having a plurality of organic insulating layers such as the upper insulating wiring layers 22 and lower insulating wire layers 24, patterned with metal. The organic insulating routing layers (22 and 24) can comprise, for example, benzocyclobutene (BCB), a silica filled epoxy, bismaleimide triazine BT) resin, Ajinomoto Build-up Film (ABF) material (provided by Ajinomoto Group of Tokyo, Japan), polyimide, etc. In various embodiments, the organic substrate may include a wafer-level package (WLP) substrate, a fan-out wafer-level packaging (FOWLP) substrate, etc.

In FIGS. 1A-D and 2, the package substrate 3 can include a non-silicon and non-glass core material 23 (e.g., FR-4 which is a glass-reinforced epoxy material). The core material 23 can have a coefficient of thermal expansion (CTE) between about 1 ppm/° C. and 20 ppm/° C., for example, between about 5 ppm/° C. and 25 ppm/° C., between about 10 ppm/° C. and 25 ppm/° C., or between about 14 ppm/° C. and 20 ppm/° C. Some low CTE core materials 23 may have a CTE less than about 10 ppm/° C., for example, less than about 5 ppm/° C. in some embodiments. In various embodiments, since the organic insulating routing layers (22 and/or 24) or the buildup layers to form the metallizations may typically include high CTE materials, the effective CTE of the organic substrate can be in a range of 10 ppm/° C. to 25 ppm/° C., for example, in a range of about 10 ppm/° C. to 20 ppm/° C. In the embodiment of FIGS. 1A-D and 2, the package substrate 3 comprises an organic core material 23 and a plurality of organic insulating wiring layers (22 and 24). In various embodiments, the organic core material 23 comprises interspersed glass particles. The package substrate 3 can comprise a printed circuit board (PCB) in various embodiments. The package substrate 3 can additionally include additional electrical interconnections such as vias 25, terminals 26, vertical interconnects 27, and horizontal traces 28 disposed in the package substrate 3 to convey electrical currents within the package substrate 3. Vertical interconnects 27 of the package substrate 3 connect to first conductive features 5. The conductive features 5 allow for electrical connections between the component 14 (e.g., the wiring layer 7) and the package substrate 3 through the bonding structure 2, which includes the bonding layer 4, first conductive features 9, and an upper bonding surface 30a.

As shown in FIG. 2, the packaging carrier 6 can include a buffer layer 12 between the package substrate 3 (e.g., upper organic insulating layers 22) and the bonding structure 2 (e.g., the bonding layer 4). The buffer layer 12 can have a coefficient of thermal expansion (CTE) between that of the package substrate 3 and the first bonding layer 4. For example, the buffer layer 12 can have a CTE between that of the insulating bonding layer 4 and an uppermost insulating layer of the upper insulating layers 22 of the package substrate 3. In some embodiments, the buffer layer 12 can have a CTE between that of the insulating bonding layer 4 and all of the organic insulating layers between the insulating bonding layer 4 and the core 23. The buffer layer 12 can have a CTE between that of the insulating bonding layer 4 and the core 23. The CTE of the buffer layer 12 can be in a range of 1 ppm/° C. to 15 ppm/° C., in a range of 2 ppm/° C. to 15 ppm/° C., or in a range of 1 ppm/° C. to 10 ppm/° C. A Young's modulus of the buffer layer 12 can be in a range of 1 Gpa to 15 Gpa, in a range of 2 Gpa to 12 Gpa, or in a range of 2 Gpa to 6 Gpa. The CTE and modulus parameters are only examples and may depend on the materials selected for the organic substrate as well as semiconductor substrate of the electronic component 14. In the illustrated embodiment, the buffer layer 12 comprises an organic material, e.g., polyimide, a liquid crystal polymer layer, or other suitable material. In some embodiments, the buffer layer 12 can comprise benzocyclobutene (BCB). The buffer layer 12 can beneficially have a CTE that provides a transition between the inorganic bonding layer 4 and the organic material(s) of the package substrate 3, so as to reduce or eliminate thermally-induced stresses that may otherwise result when the substrate or packaging structure are heated or cooled. The buffer layer 12 may comprise multiple layers of different materials (or multiple layers of the same material) in some embodiments. The buffer layer 12 therefore provides a CTE gradient between inorganic bonding layer 4 and the organic material(s) of the package substrate 3. In one embodiment, within the buffer layer 12, the CTE of the buffer material disposed over the surface of the package substrate 3 may comprise a material having a CTE that may be less than 30% of the CTE of the package substrate 3 (e.g., less than 30% of an effective or composite CTE of the package substrate 3). Also, in some applications the CTE of the material of the buffer layer 12 beneath the inorganic bonding layer 4 may comprise a material having a CTE less than 20 times the CTE of the inorganic bonding layer 4, for example, less than 15 times the CTE of the bonding layer 4. Although FIG. 2 shows only one material/layer as a buffer layer 12, a combination of two or more materials of varying thicknesses, CTEs and modulii may be implemented as buffer layers 12.

Further, as shown in FIG. 2, the packaging carrier 6 can include a hard mask layer 13 between the buffer layer 12 and the first bonding layer 4. The illustrated hard mask layer 13 may alternatively or additionally serve as an adhesion layer. The hard mask layer 13 can comprise an inorganic dielectric, such as silicon nitride. The hard mask layer 13 can serve as a mask during patterning of the underlying buffer layer 12 and provision of conductive features 5, such as by dual damascene processing for copper features. Other examples of hard mask 13 materials, include, without limitation, amorphous carbon, silicon oxynitride, silicon carbide, etc. In some embodiments, the hard mask 13 coated over the package carrier 6 may be omitted. The top surface of the package carrier 6 may be activated by treating the surface with a nitrogen or water vapor bearing plasma prior to coating the treated surface with the buffer layer 12. The activation step can improve the adhesion of the buffer layer 12 to the package carrier 6. Other methods may also be used to enhance adhesion of the buffer layer 12 to the package substrate 3, for example the incorporation of adhesion promoting agent, such as 0.1% to 5% titanate coupling agents to the buffer layer 12 to enhance the adhesion of a spin on buffer layer 12 to the package carrier 6. For patterning the bonding layer 4 and the buffer layer 12, the metal embedded at the top surface of the organic insulating routing layer may be used as the etch stop.

Returning to FIG. 1C-D, the electronic component 14 can comprise wiring layer(s) 7. The wiring layer(s) 7 can serve as an interposer, and it can be provided by way of a temporary carrier 8 that is readily removed, if desired, to leave only the wiring layer(s) 7 directly bonded on the packaging carrier 6. For example, in FIG. 1C-D, the wiring layer(s) 7 can serve to transition between the fine pitch of the electronic component 14 and a coarser pitch of the conductive features 5 in the bonding layer 4. As explained herein, additional component(s) can be directly hybrid bonded (or adhered with a conductive adhesive such as solder) to the wiring layer(s) 7. In various embodiments, the wiring layer 7 comprises lines having a pitch of less than 5 μm, for example, less than 3 μm. In various embodiments, the conductive features 5 can have a pitch of less than 40 microns, e.g., in a range of 1 micron to 50 microns or in a range of 2 microns to 50 microns. In some embodiments, the electronic component 14 further comprises a semiconductor substrate with active devices formed at least partially therein. As described with respect to FIGS. 4A-E and 5A-E below, additional electronic components 14 to fine pitch connections can then be mounted thereover by conventional connections or direct bonding (see FIG. 3).

As shown in FIG. 1C-D, the electronic component 14 can be directly bonded to the packaging carrier 6 without an adhesive along a bonding interface. The insulating bonding layer 4 can comprise an inorganic dielectric material that can be polished (e.g., by chemical-mechanical polishing) and prepared for direct bonding. The insulating bonding layer 4 can be prepared to have a bonding surface having a surface roughness of less than about 20 Å rms, e.g., less than about 15 Å rms. The bonding interface can have a higher nitrogen content than portions of the first 4 and second 9 bonding layers remote from the bonding interface. The first bonding layer 4 can comprise silicon oxide in various embodiments and can have a fluorine peak content proximate the bonding interface. The first bonding layer 4 can have a coefficient of thermal expansion (CTE) between about 0.5 ppm/° C. and 12 ppm/° C., between about 0.5 ppm/° C. and 10 ppm/° C., between about 0.5 ppm/° C. and 5 ppm/° C., or between about 0.5 ppm/° C. and 4 ppm/° C. The interface between the buffer layer 12 of FIG. 2 and the package substrate 3 can have a higher nitrogen content than portions of the buffer layer 12 or the package substrate 3.

Figure 3:
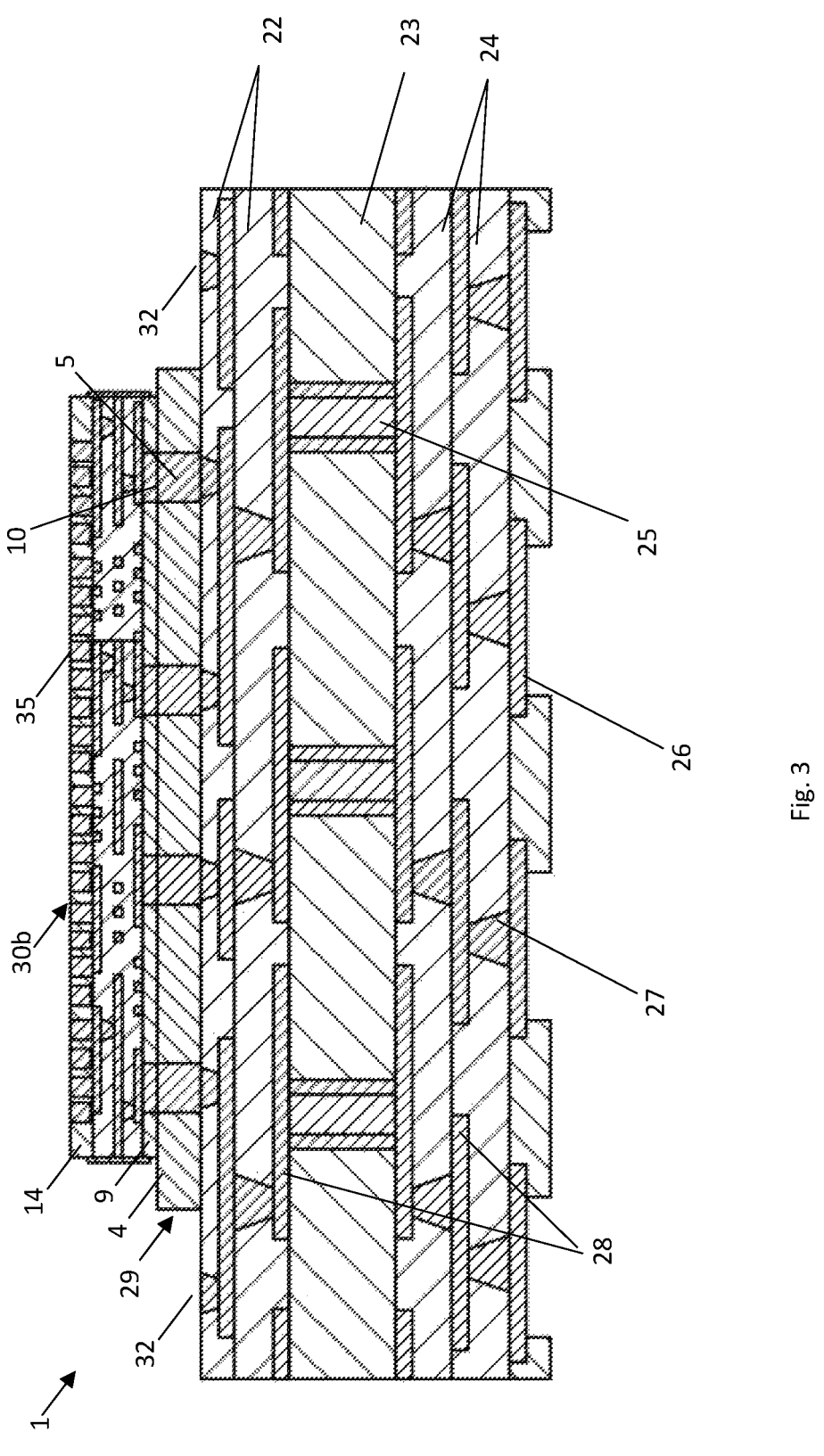
FIG. 3 is a schematic side sectional view of a bonded structure with a first bonding layer patterned to occupy less than a full surface of the package substrate.

FIG. 3 is a schematic side sectional view of a bonded structure 1 including a wiring layer 7 bonded to a packaging carrier 6 of the bonded structure 1. The wiring layer 7 can have conductive features 35 embedded in a dielectric layer at the upper hybrid bonding surface 30b. In some embodiments, such as in FIGS. 1C-D and 2, the bonding structure 2 including the bonding layer 4, first conductive features 9, and the upper bonding surface 30a of the packaging carrier 6, can occupy entirely or substantially entirely a full surface of the package substrate 3. FIG. 3 is a schematic side sectional view of a bonded structure 1 with a first bonding layer 4 patterned to occupy less than a full surface of the package substrate 3. In other embodiments, such as in FIG. 3, the first bonding layer 4 can be patterned to occupy less than a full surface of the package substrate 3 creating islands 29 on the surface of the packaging substrate 3. Utilizing less than the full surface by improving the distribution of bonding layers 4 (and/or buffer layers 12 as shown in FIG. 2) on top of the organic material of the package substrate 3 can beneficially reduce stresses in some implementations. For example, in some embodiments, the first bonding layer 4 can be patterned to form a plurality of islands 29 with a physical gap 32, also shown in FIGS. 4A-E and 5A-E, between the neighboring layers or islands 29 across a surface of the package substrate 3. The gap 32 may be filled with any suitable fill materials (e.g. low modulus material, such as polyimide), if desirable to support the wiring. In some embodiments, after forming the first bonding layer 4, in order to form an island 29 or islands of first bonding layers 4, the unwanted portion of the first bonding layer 4 can be selectively removed by dry etch or wet etch methods, or combinations thereof. The bonded structure 1 can include an electronic (e.g., semiconductor, glass, etc.) component 14 such as the packaging substrate 3 comprising an inorganic, insulating second bonding layer 9 and second conductive features 10 at a surface thereof. The first bonding layer 4 and the second bonding layer 9 can be directly bonded to one another, and the first 5 and second 10 conductive features can be directly bonded to one another. The electronic component 14 can comprise any suitable type of component on a substrate, e.g., a substrate including any one of silicon, InGaP, GaN, SiC, etc. The substrate may additionally or alternatively include glass.

Figures 4A, 4B, 4C:
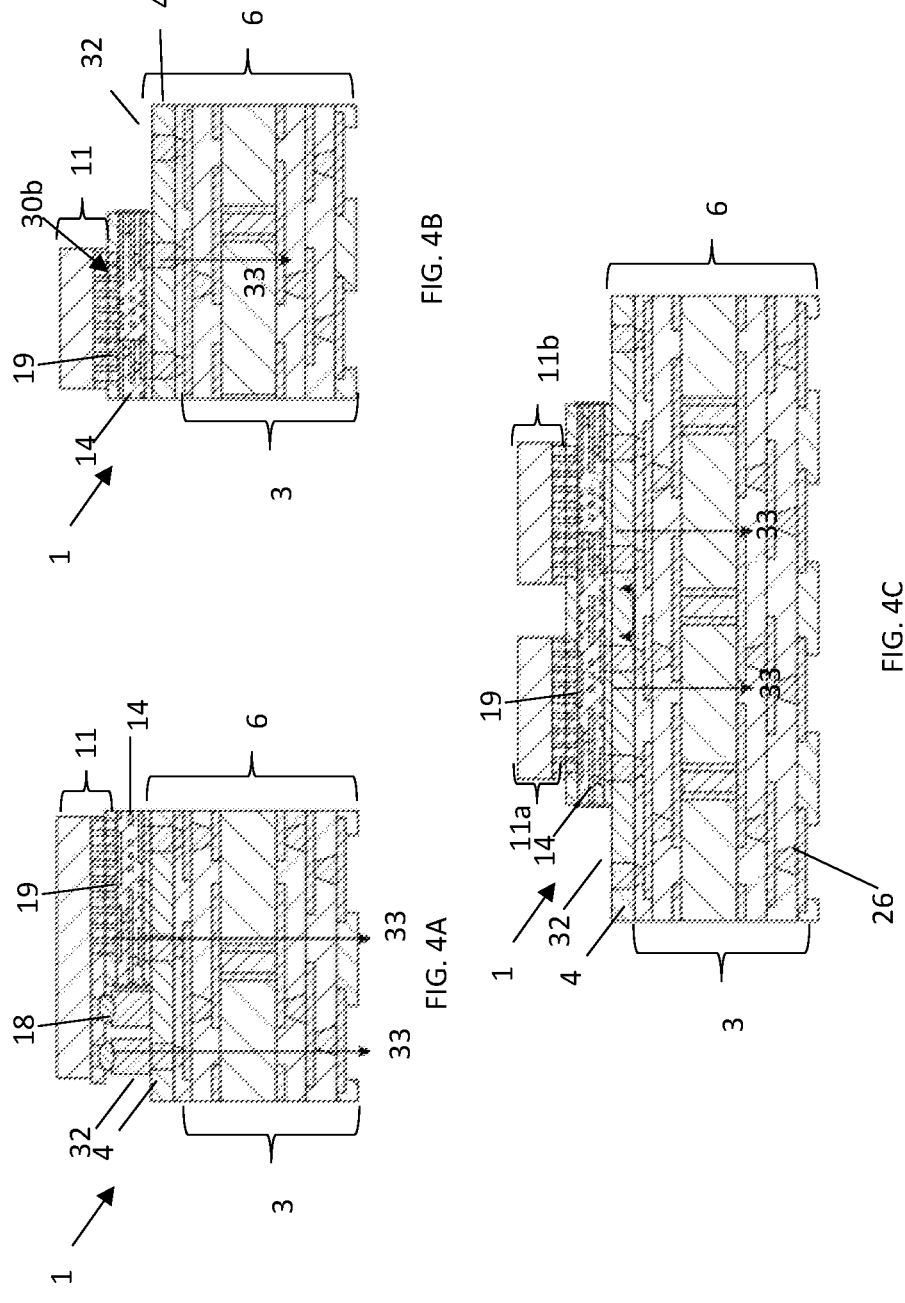
FIG. 4A-E are schematic side sectional views of one or more semiconductor devices connected to a packaging carrier, according to various embodiments.
Figures 4D, 4E:
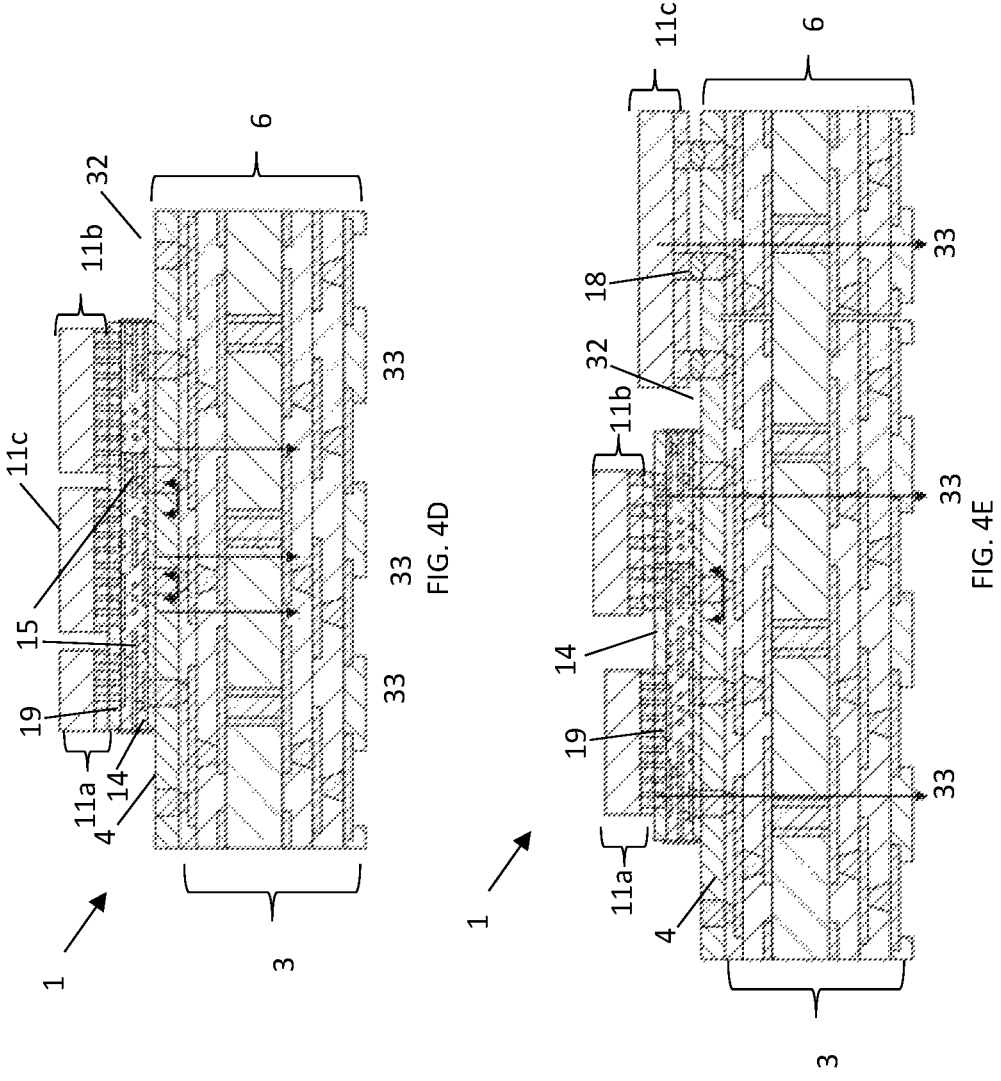
Figures 5A, 5B, 5C:
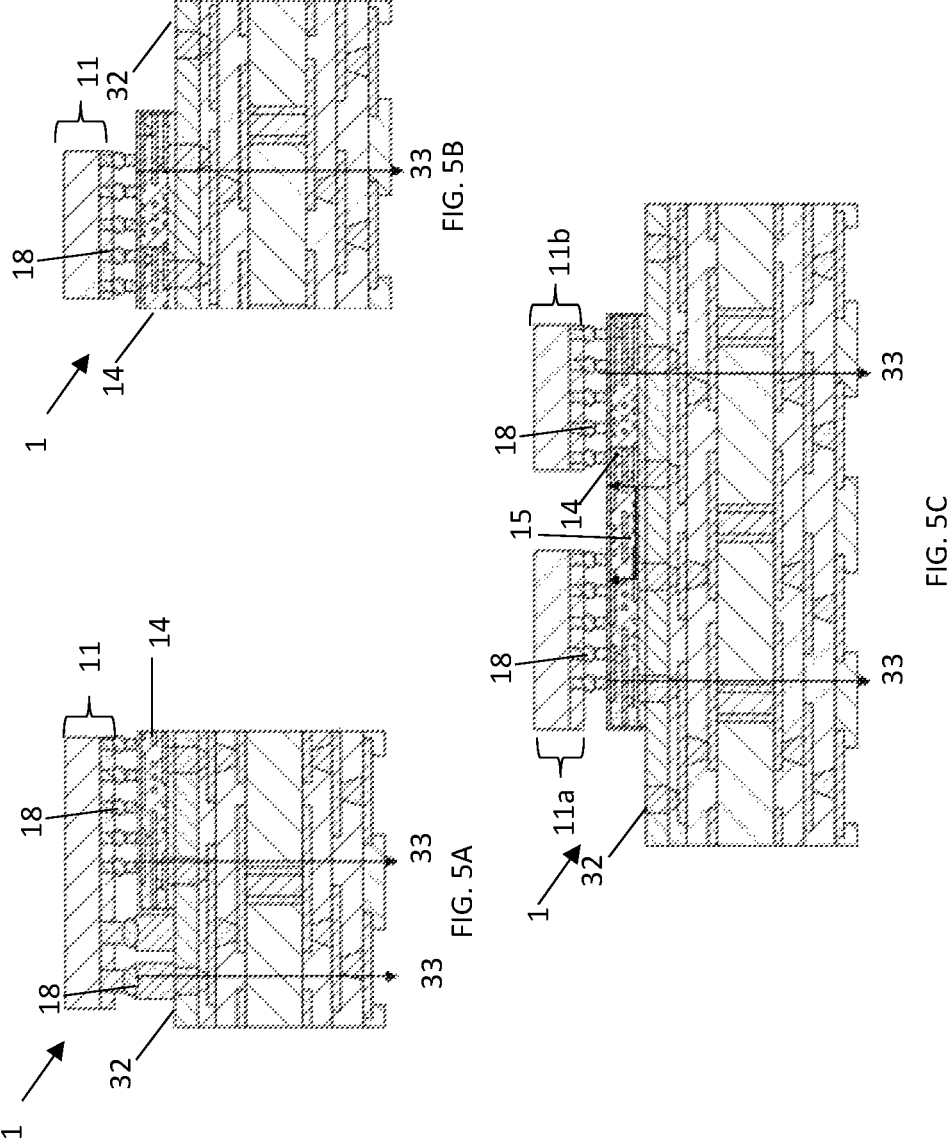
FIG. 5A-E are schematic side sectional views of a surface mounted technology assembly mounted to the hybrid direct bonded structures according to various embodiments.
Figures 5D, 5E:
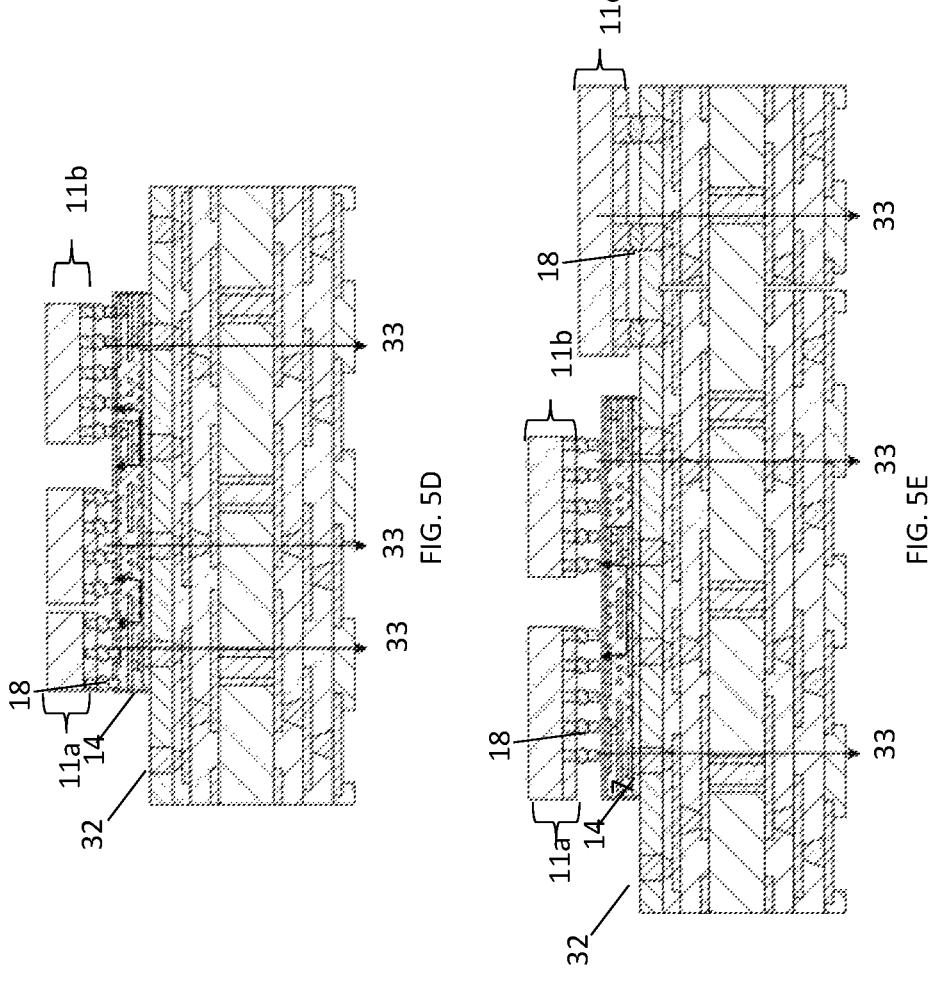

FIG. 4A-E are schematic side sectional views of one or more semiconductor devices 11 mounted to a bonded structure 1. FIGS. 4A-4E illustrate various examples of additional devices, such as semiconductor devices 11, bonded to the electronic component 14 (e.g., wiring layer 7) with vertical pathways 33 of conduction from the semiconductor device 11 through the packaging carrier 6 and the electronic component 14. In FIG. 4A, a semiconductor device 11 can be soldered to features (e.g., copper pillars) of the underlying package substrate 3 or the bonding layer 4 of the packaging carrier 6, bypassing the directly bonded device (e.g., wiring layer 7). In the illustrated example, part of a single device 11 is soldered using a plurality of solder balls 18, while another part is direct hybrid bonded along a hybrid bond interface 19 to the wiring layer 7. In FIG. 4B, the entirety of the semiconductor device 11 can be direct hybrid bonded along a hybrid bond interface 19 to the directly bonded device (wiring layer 7). In FIG. 4C, a plurality of semiconductor devices 11 are direct hybrid bonded along a hybrid bond interface 19 to the wiring layer 7. The wiring layer 7 can serve as a bridge 15 for horizontal electrical communication to provide electrical communication between adjacent dies 11a and 11b and to provide electrical communication between the semiconductor devices 11a, 11b and terminals 26 on the bottom of the packaging carrier 6. In FIG. 4D, multiple bridges 15 for horizontal electrical communication are provided for more than two (e.g., three) adjacent semiconductor devices 11a, 11b, 11c. The multiple bridges 15 provide lateral communication between adjacent semiconductor devices 11 through the wiring layer 7 of the electronic component 14. In FIG. 4E, a first semiconductor device 11a is direct hybrid bonded to the wiring layer 7, and a second semiconductor device 11b can be conventionally connected (e.g., wire bonded, or flip chip soldered using a plurality of solder balls 18 as shown) to the wiring layer 7, with the wiring layer 7 serving as a bridge to electrically connect the first and second semiconductor devices 11. A third semiconductor device 11c is also shown as conventionally connected (e.g., soldered) using a plurality of solder balls 18 to the packaging carrier 6.

FIG. 5A-E is a schematic side sectional view of a surface mounted technology assembly mounted to the hybrid direct bonded structures 1 using surface mounted technology. FIGS. 5A-5E illustrate additional examples of semiconductor devices 11 bonded to a directly bonded electronic component 14 (e.g., wiring layer 7) of the type shown in FIG. 1B-D, without an upper hybrid bonding layer on the component 14. Further devices can be connected by conventional connectors such as solder balls 18 (e.g., bond wires, thermocompression bonding or solder). In the illustrated examples, the connections between the further devices and the directly bonded electronic component 14 (wiring layer 7) comprise a conductive adhesive (e.g., solder balls 18). Thus, in some embodiments, the electronic component 14 (wiring layer 7) can be directly bonded along a hybrid bonding surface 19 to the packaging carrier 6, and one or more semiconductor devices 11 can be bonded or mounted to the electronic component 14 (wiring layer 7) with a conductive adhesive such solder balls 18.

Figure 6:
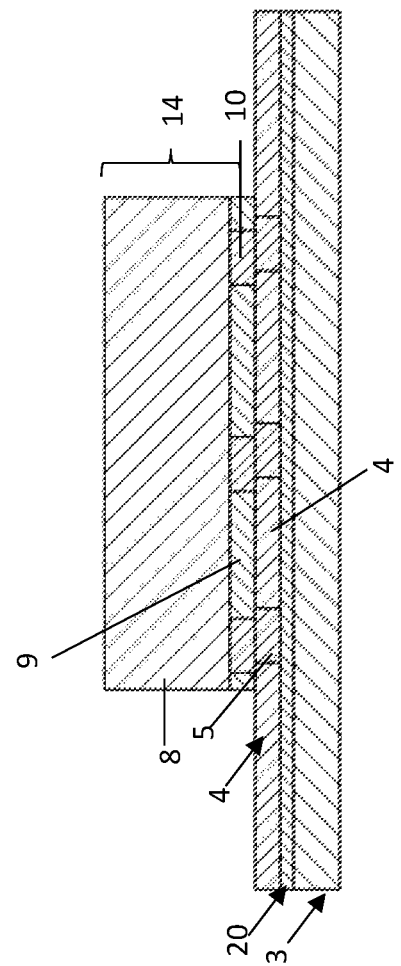
FIG. 6 is a schematic side sectional view of a semiconductor device direct hybrid bonded to a package substrate comprising a ceramic substrate.

FIG. 6 is a schematic side sectional view of a semiconductor device 11 direct hybrid bonded to a package substrate 3 comprising a ceramic substrate. FIG. 6 illustrates another embodiment, in which the package substrate 3 comprises a ceramic substrate. The ceramic substrate can comprise cordierite, silicon nitride, sapphire, alumina, silicon carbide (SiC), aluminum nitride (AlN), yttria, zirconia, mullites, a high-temperature co-fired ceramic (HTCC), beryllium oxide (BeO), a low-temperature co-fired ceramic (LTCC), etc. In some embodiments, the electronic component 14 may be directly bonded to the activated smooth surface of the ceramic substrate at room temperature, and to reduce CTE differences and related defects, the heating rate and cooling of the bonded assembly can be less than 10° C./minute, less than 5° C./min or less than 2° C./min. When there is a large CTE difference between a dielectric material of the electronic component 14 and that of the ceramic substrate, although not shown in FIG. 6, a buffer layer similar to buffer layer 12 of FIG. 2 may be provided and may be coated over the ceramic substrate to bridge the ceramic package to the bonding layer 4. The electronic component 14 includes a temporary carrier 8 that can be removed after the insulating bonding layer 4 and the contact pads 5 bond with the insulating bonding layer 10 and contact pads 5 of the electronic component 14. In some embodiments, the buffer layer 12 may comprise a low CTE polymeric layer, having a CTE less than 8 ppm/° C. In some embodiment, the bonding layer 4 may be directly formed on the ceramic substrate of the package substrate 3. The bonding layer 4 formation process may include activating the smooth surface of the ceramic material, prior to the bonding. The activation step may comprise exposing the smooth bonding surface of the ceramic substrate to one or more plasma environments. The plasma environment(s) may comprise an oxygen plasma, nitrogen plasma, helium plasma, water vapor plasma or the combinations thereof. A similar plasma exposure may be applied to the bonding surface of the ceramic substrate before forming the buffer layer 12 over the ceramic substrate. In some embodiments, an adhesion layer 20 can be provided (e.g., deposited) on the ceramic substrate. The bonding layer 4, as described above, can be provided over the adhesion layer 20, such that the adhesion layer 20 is disposed between the ceramic substrate and the bonding layer 4. In various embodiments, the adhesion layer 20 comprises an inorganic material, such as silicon nitride, silicon oxynitride, silicon carbide, or silicon oxide. A thickness of the adhesion layer 20 can be less than 500 nm, less than 100 nm, or less than 50 nm. In some embodiments, to reduce the bonding temperature of the conductive pads of electronic component 14 to bonding layer 4, the surface or recesses of the conductive pads of the electronic component 14 or the pads of the bonding layer may be coated with nanoparticles of conductive materials (not shown). For example, the coated layer can be of nanoparticles of copper or gold or silver. In some embodiments, the electronic component 14 having conductive pads comprising nanoparticles may be directly bonded to the packaged substrate 3. In some embodiments, the buffer layer 20 may be omitted over the surface of the ceramic package 3, and can instead be incorporated beneath the bonding surface of the electronic component 14. The electronic component 14 with integrated buffer layer (not shown) and having bonding surface with conductive pads comprising nanoparticles can be directly bonded to the ceramic package 3. The conductive nanoparticle by the nature of their size, can bond at lower temperatures compared their bulk counterpart. The bonding temperature of the electronic component and the package comprising of nanoparticle-coated pads bond at temperatures lower than 180° C., e.g., lower than 160° C., which is typically lower than the reflow temperature of Ag—Sn solder (typically over 200° C.). Reducing the direct bonding temperature of the electronic component 14 to the organic or ceramic package is beneficial in reducing the stresses related in CTE differences in the bonded structure.

Examples of Direct Bonding Methods and Directly Bonded Structures

Various embodiments disclosed herein relate to directly bonded structures in which two elements can be directly bonded to one another without an intervening adhesive. Two or more electronic elements, which can be semiconductor elements (such as integrated device dies, wafers, etc.) or, as described herein, non-semiconductor elements such as package substrates with inorganic insulating bonding layers, may be stacked on or bonded to one another to form a bonded structure. In the embodiments disclosed herein, the electronic component (e.g., wiring layer) can comprise a first element, and the packaging carrier can comprise a second element. The semiconductor device(s) can comprise third element(s). Conductive contact pads of one element may be electrically connected to corresponding conductive contact pads of another element. Any suitable number of elements can be stacked in the bonded structure. The contact pads may comprise metallic pads formed in a nonconductive bonding region, and may be connected to underlying metallization, such as a redistribution layer (RDL).

In some embodiments, the elements are directly bonded to one another without an adhesive. In various embodiments, a non-conductive or dielectric material of a first element can be directly bonded to a corresponding non-conductive or dielectric field region of a second element without an adhesive. The non-conductive material can be referred to as a nonconductive bonding region or bonding layer of the first element. In some embodiments, the non-conductive material of the first element can be directly bonded to the corresponding non-conductive material of the second element using dielectric-to-dielectric bonding techniques. For example, dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes. Suitable dielectric materials for direct bonding layers as described herein include but are not limited to inorganic dielectrics, such as silicon oxide, silicon nitride, or silicon oxynitride, or can include carbon, such as silicon carbide, silicon oxycarbonitride, silicon carbonitride or diamond-like carbon. In some embodiments, the dielectric materials of the bonding layers do not comprise polymer materials, such as epoxy, resin or molding materials, although underlying layers may comprise organic materials, such as for the buffer layer described herein.

In various embodiments, hybrid direct bonds can be formed without an intervening adhesive. For example, dielectric bonding surfaces can be polished to a high degree of smoothness. The bonding surfaces can be cleaned and exposed to a plasma and/or etchants to activate the surfaces. In some embodiments, the surfaces can be terminated with a species after activation or during activation (e.g., during the plasma and/or etch processes). Without being limited by theory, in some embodiments, the activation process can be performed to break chemical bonds at the bonding surface, and the termination process can provide additional chemical species at the bonding surface that improves the bonding energy during direct bonding. In some embodiments, the activation and termination are provided in the same step, e.g., a plasma or wet etchant to activate and terminate the surfaces. In other embodiments, the bonding surface can be terminated in a separate treatment to provide the additional species for direct bonding. In various embodiments, the terminating species can comprise nitrogen. Further, in some embodiments, the bonding surfaces can be exposed to fluorine. For example, there may be one or multiple fluorine peaks near layer and/or bonding interfaces. Thus, in the directly bonded structures, the bonding interface between two dielectric materials can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive contact pads of the first element can also be directly bonded to corresponding conductive contact pads of the second element. For example, a hybrid direct bonding technique can be used to provide conductor-to-conductor direct bonds along a bond interface that includes covalently direct bonded dielectric-to-dielectric surfaces, prepared as described above. In various embodiments, the conductor-to-conductor (e.g., contact pad to contact pad) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes.

For example, dielectric bonding surfaces of the bonding layers described herein can be prepared and directly bonded to one another without an intervening adhesive as explained above. Conductive contact pads (which may be surrounded by nonconductive dielectric field regions) may also directly bond to one another without an intervening adhesive. In some embodiments, the respective contact pads can be recessed below exterior (e.g., upper) surfaces of the dielectric field or nonconductive bonding regions, for example, recessed by less than 30 nm, less than 20 nm, less than 15 nm, or less than 10 nm, for example, recessed in a range of 2 nm to 20 nm, or in a range of 4 nm to 10 nm. The nonconductive bonding regions can be directly bonded to one another without an adhesive at room temperature in some embodiments in the bonding tool described herein and, subsequently, the bonded structure can be annealed. Annealing can be performed in a separate apparatus. Upon annealing, the contact pads can expand and contact one another to form a metal-to-metal direct bond. Beneficially, the use of hybrid bonding techniques, such as Direct Bond Interconnect, or DBIR, available commercially from Adeia of San Jose, CA, can enable high density of pads connected across the direct bond interface (e.g., small or fine pitches for regular arrays). In some embodiments, the pitch of the bonding pads, or conductive traces embedded in the bonding surface of one of the bonded elements, may be less 40 microns or less than 10 microns or even less than 2 microns. For some applications the ratio of the pitch of the bonding pads to one of the dimensions of the bonding pad is less than 5, or less than 3 and sometimes desirably less than 2. In other applications the width of the conductive traces embedded in the bonding surface of one of the bonded elements may range between 0.3 to 5 microns. In various embodiments, the contact pads and/or traces can comprise copper, although other metals may be suitable.

As explained herein, the first and second elements (e.g., the electronic component illustrated herein as a wiring layer and the packaging carrier) can be directly bonded to one another without an adhesive, which is different from a deposition process. The first and second elements can accordingly comprise non-deposited elements. Further, directly bonded structures, unlike deposited layers, can include a defect region along the bond interface in which nanovoids are present. The nanovoids may be formed due to activation of the bonding surfaces (e.g., exposure to a plasma). As explained above, the bond interface can include concentration of materials from the activation and/or last chemical treatment processes. For example, in embodiments that utilize a nitrogen plasma for activation, a nitrogen peak can be formed at the bond interface. In embodiments that utilize an oxygen plasma for activation, an oxygen peak can be formed at the bond interface. In some embodiments, the bond interface can comprise silicon oxynitride, silicon oxycarbonitride, or silicon carbonitride. As explained herein, the direct bond can comprise a covalent bond, which is stronger than van Der Waals bonds. The bonding layers can also comprise polished surfaces that are planarized to a high degree of smoothness. For example, the bonding layers may have a surface roughness of less than 2 nm root mean square (RMS) per micron, or less than 1 nm RMS per micron.

In various embodiments, metal-to-metal bonds between the conductive features (e.g., contact pads) in direct hybrid bonded structures can be joined such that conductive features grains, for example copper grains on the conductive features grow into each other across the bond interface. In some embodiments, the copper can have grains oriented along the 111 crystal plane for improved copper diffusion across the bond interface. The bond interface can extend substantially entirely to at least a portion of the bonded contact pads, such that there is substantially no gap between the nonconductive bonding regions at or near the bonded contact pads. In some embodiments, a barrier layer may be provided under the contact pads (e.g., which may include copper). In other embodiments, however, there may be no barrier layer under the contact pads, for example, as described in US 2019/0096741, which is incorporated by reference herein in its entirety and for all purposes.

In one embodiment, a bonded structure can include a package substrate comprising an inorganic, insulating first bonding layer and first conductive features at a surface thereof; and an electronic component comprising an inorganic, insulating second bonding layer and second conductive features at a surface thereof, wherein the first bonding layer and the second bonding layer are directly bonded to one another, and the first and second conductive features are directly bonded to one another.

In some embodiments, the package substrate comprises a non-silicon and non-glass core material. In some embodiments, the package substrate comprises core material having a coefficient of thermal expansion (CTE) between about 5 ppm/° C. and 25 ppm/° C. In some embodiments, the package substrate comprises an organic core material. In some embodiments, the organic core material comprises interspersed glass particles. In some embodiments, the package substrate comprises a printed circuit board (PCB). In some embodiments, the bonded structure can include a buffer layer between the package substrate and the first bonding layer, the buffer layer having a coefficient of thermal expansion (CTE) between that of the package substrate and the first bonding layer. In some embodiments, the buffer layer comprises an organic material. In some embodiments, the buffer layer comprises polyimide. In some embodiments, the buffer layer comprises a liquid crystal polymer layer. In some embodiments, the buffer layer comprises benzocyclobutene (BCB). In some embodiments, the bonded structure can include a hard mask layer between the buffer layer and the first bonding layer. In some embodiments, the hard mask layer comprises an inorganic dielectric. In some embodiments, the hard mask layer comprises silicon nitride. In some embodiments, the package substrate comprises a ceramic substrate. In some embodiments, the bonded structure can include an adhesion layer between the bonding layer and the package substrate. In some embodiments, the adhesion layer comprises an inorganic material. In some embodiments, the electronic component comprises a wiring layer. In some embodiments, the wiring layer comprises lines having a pitch of less than 20 μm. In some embodiments, the wiring layer serves as an interposer without a bulk substrate. In some embodiments, the bonded structure can include a semiconductor device directly bonded on the electronic component. In some embodiments, the bonded structure can include a semiconductor device soldered on the electronic component. In some embodiments, the electronic component further comprises a semiconductor substrate with active devices formed at least partially therein. In some embodiments, a bonding interface between the first and second bonding layers comprises a higher nitrogen content than portions of the first and second bonding layers remote from the bonding interface. In some embodiments, the the first bonding layer comprises at least one of silicon oxide and has a fluorine peak content proximate a bonding interface between the first and second bonding layers. In some embodiments, the first bonding layer comprises at least one of silicon oxide, silicon nitride, silicon oxynitride, silicon carbide, silicon oxycarbide, silicon carbonitride, silicon oxycarbonitride, aluminum oxide, aluminum nitride, and zirconium oxide. In some embodiments, the first bonding layer has a coefficient of thermal expansion (CTE) between about 0.5 ppm/° C. and 12 ppm/° C. In some embodiments, the first bonding layer is patterned to occupy less than a full surface of the package substrate. In some embodiments, the first bonding layer is patterned to form a plurality of islands across a surface of the package substrate.

In another embodiment, a packaging carrier configured for direct bonding with another electronic component is disclosed, the packaging carrier comprising: a ceramic or organic package core; an inorganic, insulating bonding layer and embedded and exposed conductive features at a bonding surface thereof, the bonding surface having a surface roughness of less than about 20 Å rms.

In some embodiments, the package core comprises an organic material. In some embodiments, the packaging carrier can include an organic layer between the package core and the first bonding layer. In some embodiments, the organic layer comprises polyimide. In some embodiments, the packaging carrier can include an intervening inorganic dielectric layer between the organic layer and the first bonding layer. In some embodiments, the intervening inorganic dielectric layer comprises silicon nitride. In some embodiments, the bonding surface comprises a higher nitrogen content than portions of bonding layer remote from the bonding surface. In some embodiments, the bonding layer comprises silicon oxide and has a fluorine peak content proximate the bonding surface. In some embodiments, the bonding layer has a coefficient of thermal expansion (CTE) between about 0.5 ppm/° C. and 12 ppm/° C. In some embodiments, the bonding layer is patterned to occupy less than a full surface of the packaging carrier. In some embodiments, the bonding layer is patterned to form a plurality of islands across the packaging carrier. In some embodiments, the conductive features are recessed below the bonding surface by between about 2 nm and 20 nm. In some embodiments, the bonding layer comprises a material selected from the group consisting of silicon oxide, silicon nitride, silicon oxynitride, silicon carbide, silicon oxycarbide, silicon carbonitride, silicon oxycarbonitride, aluminum oxide, aluminum nitride, and zirconium oxide.

In another embodiment, a method for direct bonding can include: depositing an inorganic bonding layer on an organic or ceramic package substrate; embedding conductive features in the bonding layer; and preparing the bonding layer for direct hybrid bonding with a second electronic component.

In some embodiments, the method can include directly hybrid bonding the second electronic component to the bonding layer such that a second inorganic bonding layer of the second electronic component directly bonds to the bonding layer and a second conductive features of the second electronic component directly bonds to the conductive features embedded in the bonding layer. In some embodiments, the second electronic component comprises a wiring layer. In some embodiments, the wiring layer comprises lines having a pitch of less than 20 μm. In some embodiments, the method can include thinning or removing a carrier from second electronic component after directly bonding to leave an interposer structure. In some embodiments, the embedding the conductive features comprises damascene processing. In some embodiments, the embedding the conductive features comprises recessing the conductive features by between 2 nm and 20 nm below a bonding surface of the bonding layer. In some embodiments, preparing the bonding layer for directly bonding comprises polishing the bonding layer to have a surface roughness less than about 20 Å rms. In some embodiments, preparing the bonding layer for directly bonding further comprises treating a surface of the bonding layer and the conductive features to form nitrogen terminations. In some embodiments, the method can include depositing a buffer layer on the package substrate prior to depositing the bonding layer, wherein the package substrate comprises an organic core material and the buffer layer has a coefficient of thermal expansion (CTE) between that of the packaging carrier and the first bonding layer. In some embodiments, the buffer layer comprises a polymer layer. In some embodiments, the core material comprises FR-4. In some embodiments, the method can include depositing a masking layer on the buffer layer prior to depositing the bonding layer. In some embodiments, the masking layer comprises a silicon nitride layer. In some embodiments, depositing the bonding layer comprises plasma vapor deposition. In some embodiments, the bonding layer comprises a material selected from the group consisting of silicon oxide, silicon nitride, silicon oxynitride, silicon carbide, silicon oxycarbide, silicon carbonitride, silicon oxycarbonitride, aluminum oxide, aluminum nitride, and zirconium oxide. In some embodiments, the method can include patterning the bonding layer to remove the bonding layer from some surfaces of the package substrate and leave the bonding layer in locations where direct bonding will be performed. In some embodiments, the method can include masking the package substrate such that depositing the bonding layer is limited to locations of the package substrate where direct bonding will be performed. In some embodiments, the method can include depositing an adhesion layer on the package substrate prior to depositing the bonding layer, wherein the package substrate comprises a ceramic material.

In another embodiment, a packaging carrier configured for direct bonding with another electronic component is disclosed. The packaging carrier can include: a package core comprising a ceramic or organic material; and an inorganic, insulating bonding layer having embedded conductive features exposed at a bonding surface thereof, the bonding surface having a surface roughness of less than about 20 Å rms.

In some embodiments, the package core comprises the ceramic material, and the ceramic material comprises at least one of cordierite, silicon nitride, silicon carbide, aluminum nitride, alumina, yttria, sapphire, zirconia and mullites.

In some embodiments, a bonding structure comprises an inorganic bonding layer deposited on an organic or ceramic package substrate and conductive features embedded in the bonding layer, the bonding layer prepared for direct hybrid bonding with a second electronic component. In some embodiments of the bonding structure, the second electronic component is directly hybrid bonded to the bonding layer such that a second inorganic bonding layer of the second electronic component directly bonds to the bonding layer and a second conductive features of the second electronic component directly bonds to the conductive features embedded in the bonding layer. In some embodiments of the bonding structure, a carrier is thinned or removed from the second electronic component after directly bonding to leave an interposer structure.

In some embodiments, a packaging carrier configured for direct bonding with another electronic component, the packaging carrier comprising a package core comprising a ceramic or organic material and an inorganic, insulating bonding layer having embedded conductive features exposed at a bonding surface thereof, the bonding surface of the conductive features comprising of nanoparticles. In some embodiments of the packaging carrier, the package core comprises an organic material. In some embodiments, the packaging carrier of further comprises an organic layer between the package core and the first bonding layer. In some embodiments of the packaging carrier, the organic layer comprises polyimide.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A method for direct bonding, comprising:
   depositing an inorganic bonding layer on an organic or ceramic package substrate;
   embedding conductive features in the bonding layer; and
   preparing the bonding layer for direct hybrid bonding with a second electronic component,
   wherein preparing the bonding layer comprises treating a surface of the bonding layer and the conductive features to form nitrogen terminations.

2. The method of claim 1, further comprising directly hybrid bonding the second electronic component to the bonding layer such that a second inorganic bonding layer of the second electronic component directly bonds to the bonding layer and a second conductive features of the second electronic component directly bonds to the conductive features embedded in the bonding layer.

3. The method of claim 2, wherein the second electronic component comprises a wiring layer.

4. The method of claim 1, further comprising thinning or removing a carrier from second electronic component after directly bonding to leave an interposer structure.

5. The method of claim 1, wherein the embedding conductive features comprises damascene processing.

6. The method of claim 1, wherein preparing the bonding layer for directly bonding comprises polishing the bonding layer to have a surface roughness less than about 20 Å rms.

7. The method of claim 1, further comprising depositing a buffer layer on the package substrate prior to depositing the bonding layer, wherein the package substrate comprises an organic core material and the buffer layer has a coefficient of thermal expansion (CTE) between that of the package substrate and the bonding layer.

8. The method of claim 7, further comprising depositing a masking layer on the buffer layer prior to depositing the bonding layer.

9. The method of claim 1, further comprising patterning the bonding layer to remove the bonding layer from some surfaces of the package substrate and leave the bonding layer in locations where direct bonding will be performed.

10. The method of claim 1, further comprising depositing an adhesion layer on the package substrate prior to depositing the bonding layer, wherein the package substrate comprises a ceramic material.

11. A bonded structure, comprising:

a package substrate comprising an inorganic, insulating first bonding layer and first conductive features at a surface thereof; and a buffer layer on the package substrate between the first bonding layer and the package substrate; and an electronic component comprising an inorganic, insulating second bonding layer and second conductive features at a surface thereof, wherein the first bonding layer and the second bonding layer are directly bonded to one another, and the first and second conductive features are directly bonded to one another; and wherein the buffer layer has a coefficient of thermal expansion (CTE) between that of the package substrate and the first bonding layer.

12. The bonded structure of claim 11, further comprising a hard mask layer between the buffer layer and the first bonding layer.

13. The bonded structure of claim 12, further comprising an adhesion layer between the first bonding layer and the package substrate.

14. The bonded structure of claim 13, further comprising a semiconductor device directly bonded on the electronic component.

15. The bonded structure of claim 14, wherein the electronic component comprises a wiring layer.

16. A packaging carrier configured for direct bonding with another electronic component, the packaging carrier comprising:

a ceramic or organic package core;

a buffer layer on the package core;

an inorganic and insulating bonding layer on the buffer layer, and embedded and exposed conductive features at a bonding surface thereof, the bonding surface having a surface roughness of less than about 20 Å rms, wherein the buffer layer has a coefficient of thermal expansion (CTE) between that of the package core and the bonding layer.

17. The packaging carrier of claim 16, further comprising an intervening inorganic dielectric layer between the package core and the bonding layer.

18. The packaging carrier of claim 16, wherein the bonding layer is patterned to occupy less than a full surface of the packaging carrier.

* * * * *